(12) United States Patent
Hosono

(10) Patent No.: US 8,971,115 B2
(45) Date of Patent: Mar. 3, 2015

(54) SEMICONDUCTOR MEMORY DEVICE

(71) Applicant: Kabushiki Kaisha Toshiba, Tokyo (JP)

(72) Inventor: Koji Hosono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/014,026

(22) Filed: Aug. 29, 2013

(65) Prior Publication Data

US 2014/0247658 A1    Sep. 4, 2014

(30) Foreign Application Priority Data

Mar. 1, 2013 (JP) .................................. 2013-040741

(51) Int. Cl.
*G11C 11/34* (2006.01)
*G11C 16/24* (2006.01)
*G11C 16/04* (2006.01)

(52) U.S. Cl.
CPC ............ *G11C 16/24* (2013.01); *G11C 16/0483* (2013.01)
USPC .................................. 365/185.11; 365/185.24

(58) Field of Classification Search
USPC ........................................ 365/185.11, 185.24
See application file for complete search history.

(56) References Cited

U.S. PATENT DOCUMENTS

| 6,252,800 | B1 | 6/2001 | Chida |
| 6,262,926 | B1 | 7/2001 | Nakai |
| 6,462,985 | B2 | 10/2002 | Hosono et al. |
| 7,821,832 | B2 * | 10/2010 | Hahn ........................ 365/185.11 |
| 8,339,856 | B2 * | 12/2012 | Iwata ........................ 365/185.17 |
| 8,634,251 | B2 * | 1/2014 | Chung ...................... 365/185.25 |
| 8,681,561 | B2 * | 3/2014 | Tanzawa ................... 365/185.18 |
| 2012/0069655 | A1 | 3/2012 | Hishida et al. |
| 2012/0069662 | A1 | 3/2012 | Sakurai et al. |

FOREIGN PATENT DOCUMENTS

JP        2012-069695 A     4/2012

* cited by examiner

*Primary Examiner* — Michael Tran
(74) *Attorney, Agent, or Firm* — Patterson & Sheridan, LLP

(57) ABSTRACT

A semiconductor memory device includes a string of memory cell transistors that are connected to each other in series. A selection transistor is connected between one end of the string of the memory cell transistors and one of a source line and a bit line. A line is selectively connected to a gate electrode of the selection transistor, a driver, or a node that supplies an unselected voltage, or is set to be in a floating state.

19 Claims, 29 Drawing Sheets

FIG. 27
```
L1  L0  STATE DEFINITION
0   0   NORMAL BLOCK
0   1   BAD BLOCK
1   0   BAD BLOCK & SGSL FLOATING
1   1   BAD BLOCK & SGSL, SGDL FLOATING
```
FIG. 28
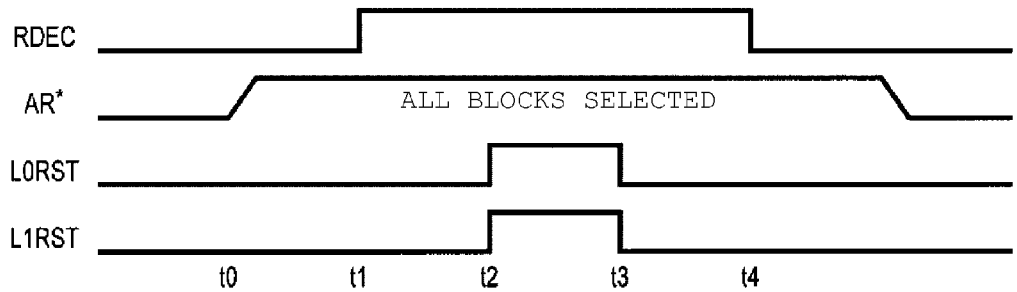
FIG. 29
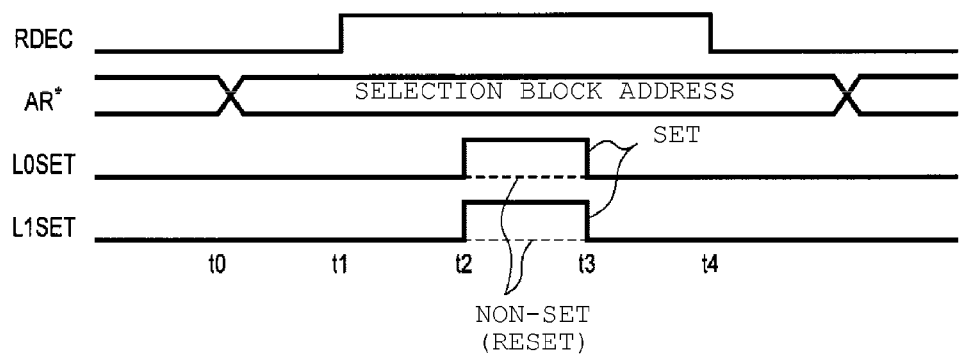

FIG. 31

| L1 | L0 | STATE DEFINITION |
|----|----|------------------|
| 0 | 0 | NORMAL BLOCK |
| 0 | 1 | BAD BLOCK |
| 1 | 0 | BAD BLOCK & SGSL FLOATING |
| 1 | 1 | BAD BLOCK & SGDL FLOATING |

# SEMICONDUCTOR MEMORY DEVICE

CROSS-REFERENCE TO RELATED APPLICATION

This application is based upon and claims the benefit of priority from Japanese Patent Application No. 2013-040741, filed Mar. 1, 2013, the entire contents of which are incorporated herein by reference.

FIELD

Embodiments described herein relate to generally a semiconductor memory device.

BACKGROUND

NAND-type flash memories having a 3-dimensional structure which are manufactured using a BiCS manufacturing technique are known in the art.

DESCRIPTION OF THE DRAWINGS

FIG. 27 is a diagram showing a combination of signals according to the third embodiment.
FIG. 28 is a timing chart for resetting a latch according to the third embodiment.
FIG. 29 is a timing chart for setting the latch according to the third embodiment.
FIG. 31 is a diagram showing a combination of signals according to the fourth embodiment.

DETAILED DESCRIPTION

In general, according to one embodiment, provided is a semiconductor memory device that is capable of a normal operation.

A semiconductor memory device according to an embodiment includes a string of memory cell transistors that are connected to each other in series. A selection transistor is connected between one end of the string of the memory cell transistors and one of a source line and a bit line. A line is selectively connected to a gate electrode of the selection transistor, a driver, or a node that supplies an unselected voltage, or the line is set to be in a floating state.

First Embodiment

Figure 1:
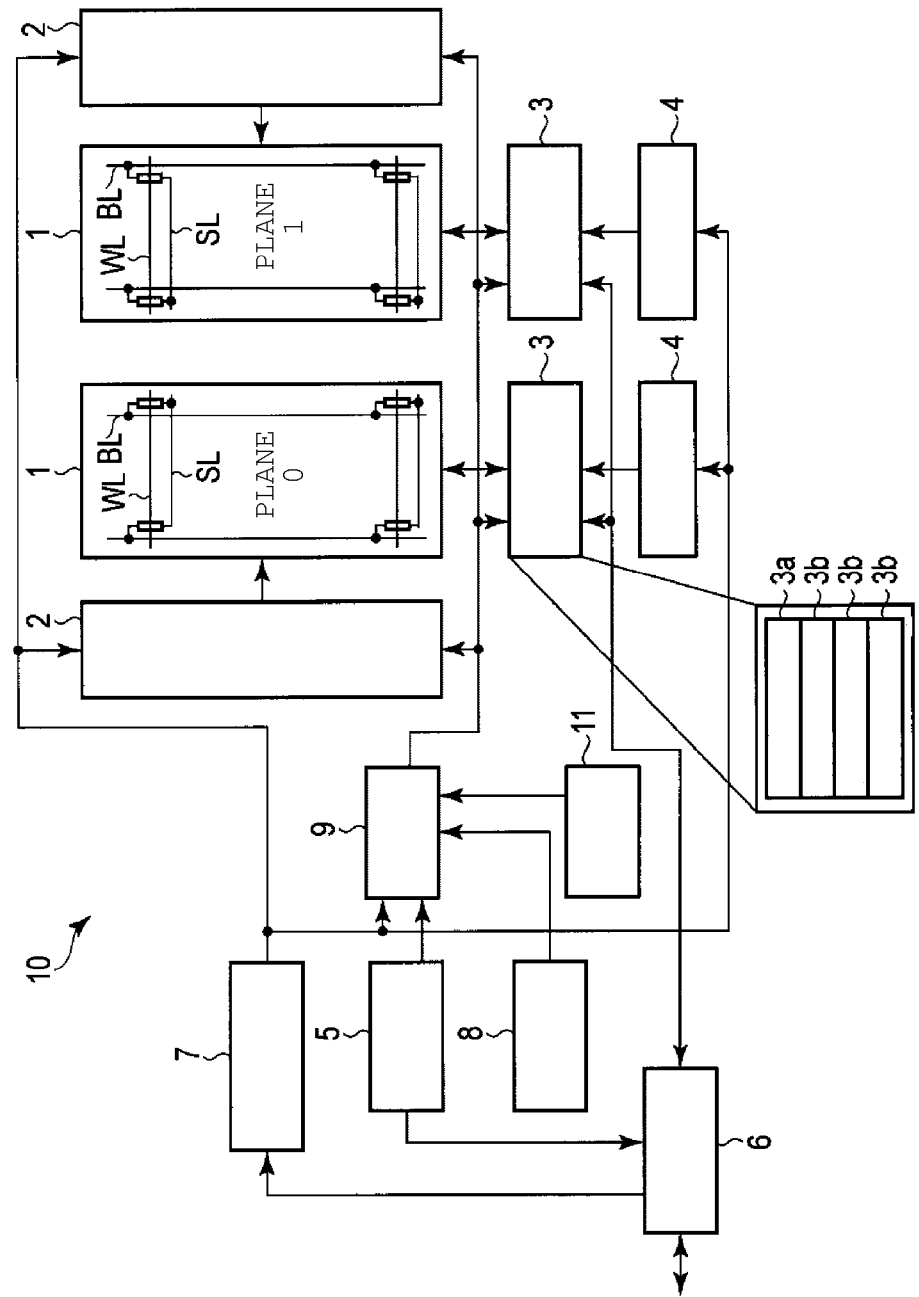
FIG. 1 is a block diagram of a semiconductor memory device according to a first embodiment.

FIG. 1 is a block diagram of a semiconductor memory device 10 according to a first embodiment. Each functional block can be embodied as any one of hardware and computer software, or a combination thereof. For this reason, on the whole, description will be given below from the viewpoint of a function of each block such that it will be apparent that each block may be either one of hardware and computer software, or a combination thereof.

In addition, it is not essential that each functional block is distinguished as in the following example. For example, the functional block may be executed by a functional block different from a functional block whose functions are exemplified. Further, the exemplified functional block may be divided into smaller functional sub-blocks.

As shown in FIG. 1, the semiconductor memory device 10 includes memory cell arrays 1, row decoders 2, data circuit and page buffers 3, column decoders 4, a control circuit 5, an input and output circuit 6, an address and command register 7, a voltage generating circuit 8, a core driver 9, and a leakage detection circuit 11.

The semiconductor memory device 10 includes a plurality of the memory cell arrays (two memory cell arrays are exemplified) 1. The memory cell array 1 may be referred to as a plane. The memory cell array 1 includes a plurality of blocks (memory blocks). Each block includes a plurality of memory cells, word lines WL, bit lines BL, and the like. A storage space of a certain plurality of memory cells constitutes one page or a plurality of pages. Data is read and written in page units. Details of the memory cell array 1 will be described below.

A set of the row decoder 2, the data circuit and page buffer 3, and the column decoder 4 is provided in each memory cell array 1. The row decoder 2 receives a block address signal and the like from the address and command register 7, and receives a word line control signal and a selection gate line control signal from the core driver 9. The row decoder 2 selects a block, a word line, and the like based on the received block address signal, word line control signal, and selection gate line control signal.

The data circuit and page buffer 3 temporarily holds data that is read from the memory cell array 1, receives write data from the outside of the semiconductor memory device 10, and writes the received data in the memory cell selected. The data circuit and page buffer 3 includes a sense amplifier 3a. The sense amplifier 3a includes a plurality of sense amplifiers that are respectively connected to the plurality of bit lines BL, and amplifies potentials on the bit lines BL. The semiconductor memory device 10 can hold 2 bits or more of data in one memory cell. For this reason, the data circuit and page buffer 3 includes, for example, three data caches 3b. The first data cache 3b holds one of lower page data and upper page data, and the second data cache 3b holds the other one of the lower page data and the upper page data. The lower page data is constituted by a set of lower bits in each 2 bits of data of a plurality of associated memory cells. The upper page data is constituted by a set of upper bits in each 2 bits of data of a plurality of associated memory cells. The third data cache 3b temporarily holds, for example, data that is re-written in the memory cell based on results of verification reading.

The column decoder 4 receives a column address signal from the address and command register 7, and decodes the received column address signal. The column decoder 4 controls input and output of data of the data circuit and page buffer 3 on the basis of the decoded address signal.

The control circuit 5 receives commands for instructing reading, writing, erasing, and the like from the address and command register 7. The control circuit 5 controls the voltage generating circuit 8 and the core driver 9 according to a desired sequence, on the basis of the instruction of the commands. The voltage generating circuit 8 generates various voltages according to the instruction of the control circuit 5. The core driver 9 controls the row decoder 2 and the data circuit and page buffer 3 in order to control the word lines WL and the bit lines BL, according to the instruction of the control circuit 5. The input and output circuit 6 controls the input of a command, an address, and data from the outside of the semiconductor memory device 10, or controls the output thereof to the outside of the semiconductor memory device 10. The leakage detection circuit 11 detects the presence of certain amount of leakage in a certain place of the memory cell array 1, and the details thereof will be described below.

Figure 2:
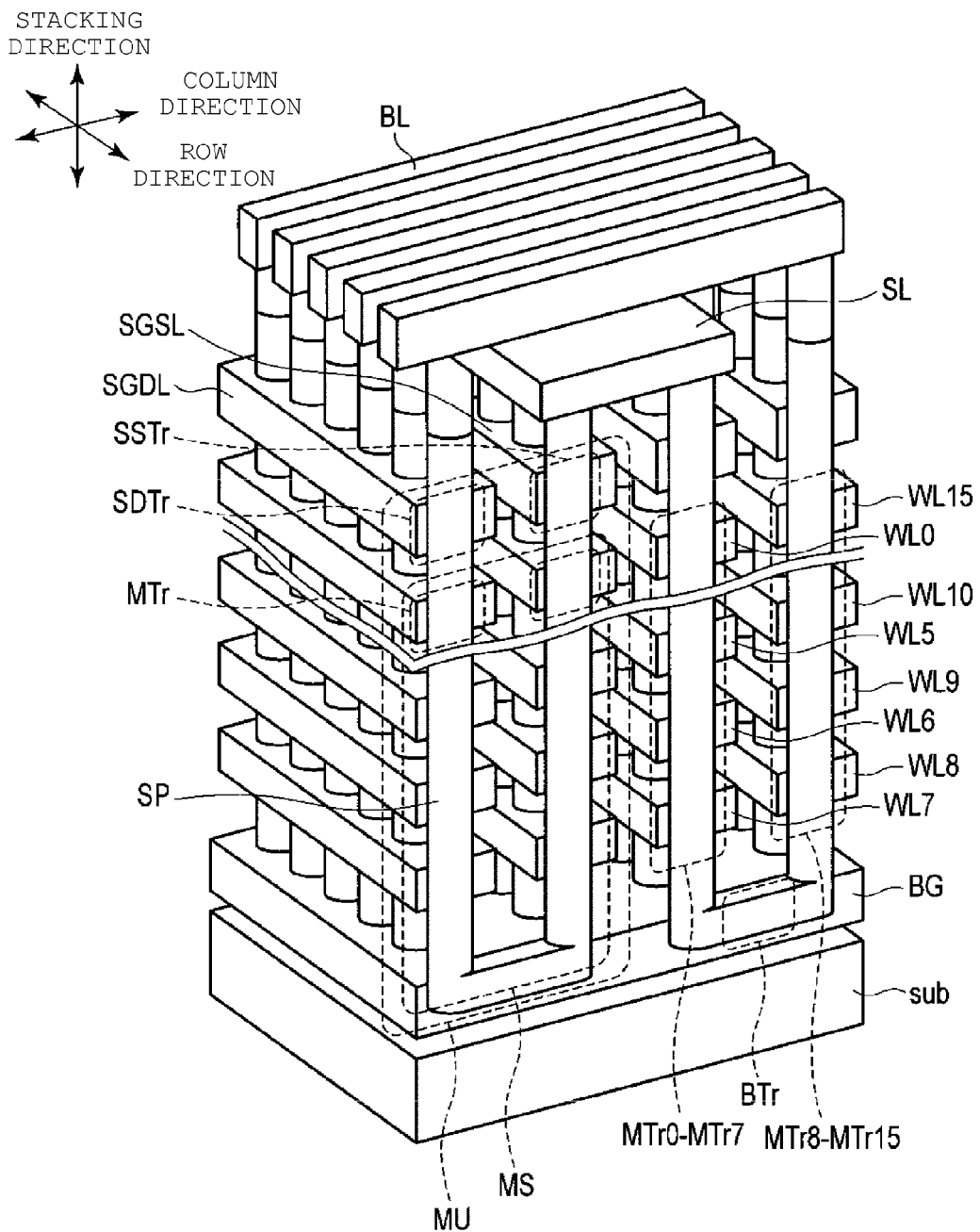
FIG. 2 is a perspective view of a part of a memory cell array according to the first embodiment.
Figure 3:
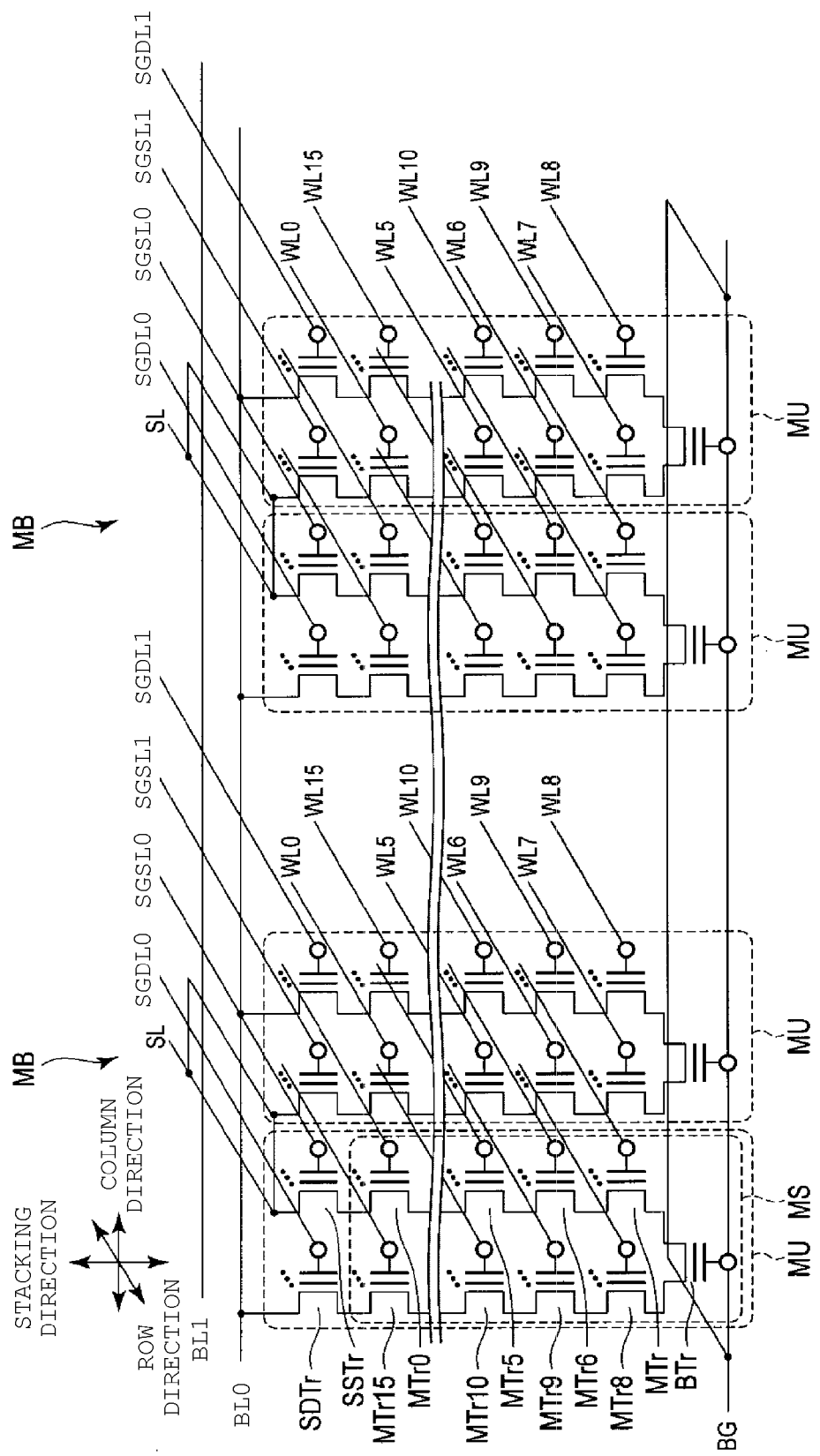
FIG. 3 is a circuit diagram of a part of the memory cell array according to the first embodiment.

The memory cell array 1 has a structure shown in FIGS. 2 and 3. FIG. 2 is a perspective view of a part of the memory cell array according to the first embodiment. FIG. 3 is a circuit diagram of a part of the memory cell array 1 according to the first embodiment. As shown in FIGS. 2 and 3, the memory cell array 1 includes the plurality of bit lines BL, a plurality of source (cell source) lines SL, and a plurality of blocks MB. The source lines SL extend in a row direction. The bit lines BL extend in a column direction. The column direction is perpendicular to the row direction. The plurality of blocks MB are lined up along the column direction at a desired pitch. Each block MB includes a plurality of memory units MU that are lined up in a matrix along the row direction and the column direction. In each block MB, the plurality of memory units MU are connected to one bit line BL.

The memory unit MU includes a memory string MS, a selection gate transistor SSTr on the source side, and a selection gate transistor SDTr on the drain side. The memory string MS is located above a substrate sub along a stacking direction. The memory string MS includes n+1 (for example, n is fifteen) memory cell transistors MTr0 to MTr15 that are connected to each other in series, and a back gate transistor BTr. When reference numerals and signs accompanied by numbers at the ends thereof are not required to be distinguished from each other (for example, cell transistor MTr), the numbers at the ends thereof are omitted, and it is assumed that the description indicates all the numbered reference numerals and signs. The cell transistors MTr0 to MTr7 are lined up in this order in a direction coming close to the substrate sub along the stacking direction. The cell transistors MTr8 to MTr15 are lined up in this order in a direction away from the substrate sub along the stacking direction. As will be described in detail below, the cell transistor MTr includes a semiconductor pillar SP, an insulating film of a surface of a semiconductor pillar SP, and the word line (control gate) WL. The back gate transistor BTr is connected between the cell transistor MTr7 and the cell transistor MTr8 that are located on the lowermost side.

The selection gate transistors SSTr and SDTr are located above the cell transistor MTr0 and the cell transistor MTr15 that are located on the uppermost side, along the stacking direction. A drain of the transistor SSTr is connected to a source of the cell transistor MTr0. A source of the transistor SDTr is connected to a drain of the cell transistor MTr15. A source of the transistor SSTr is connected to the source line SL. A drain of the selection gate transistor SDTr is connected to the bit line BL (BL0, BL1, ..., BLm).

Gates of the cell transistors MTr0 of the plurality of memory units MU that are lined up along the row direction in each block MB are commonly connected to the word line WL0. Similarly, gates of the cell transistors MTr1 to MTr15 of the plurality of memory units MU that are lined up along the row direction in each block MB are commonly connected to the word lines WL1 to WL15, respectively. The word lines WL extend in the row direction. Gates of the back gate transistors BTr are commonly connected to a back gate line BG.

Gates of the transistors SDTr of the plurality of memory units MU that are lined up along the row direction in each block MB are commonly connected to a selection gate line SGDL (SGDL0, SGDL1, ..., SGDLi) on the drain side. Drains of the transistors SDTr of the plurality of memory units MU that are lined up along the column direction are connected to the same bit line BL. The selection gate line SGDL (SGDL0, SGDL1, ..., SGDLi) extends in the row direction.

Gates of the transistors SSTr of the plurality of memory units MU that are lined up along the row direction in each block MB are commonly connected to a selection gate line SGSL (SGSL0, SGSL1, ..., SGSLi) on the source side. Sources of the transistors SSTr of two memory units MU that are lined up along the column direction are connected to the same source line SL. Sources of the transistors SSTr of the plurality of memory units MU that are lined up along the row direction in one block MB are connected to the same source line SL. The selection gate lines SGSL (SGSL0, SGSL1, ..., SGSLi) and the source lines SL extend in the row direction.

Figure 4:
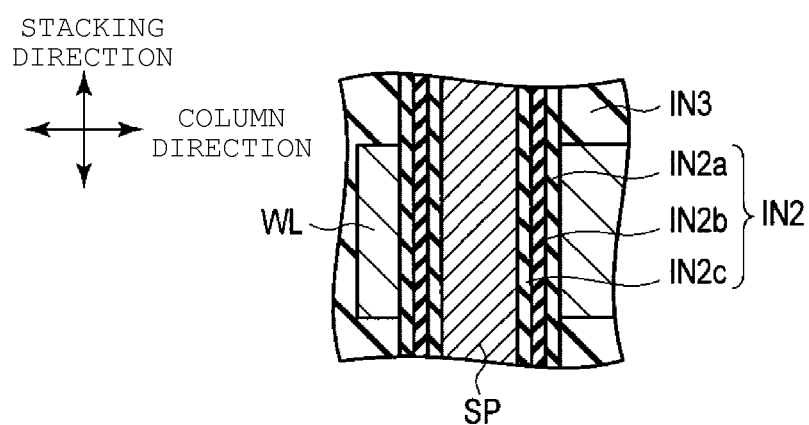
FIG. 4 is a cross-sectional view of a memory cell transistor according to the first embodiment.

The cell transistor MTr has a structure shown in FIG. 4. FIG. 4 is a cross-sectional view of the memory cell transistor according to the first embodiment. The word line (gate) WL is constituted by, for example, polysilicon or polycide. A hole which passes through the plurality of word lines WL and the insulating film is formed between the word lines WL. An insulating film IN2 is formed on the surface of the hole, and the semiconductor pillar SP is formed in the hole. The semiconductor pillars SP extend in the stacking direction, are lined up in a matrix along a plane constituted by the row direction and the column direction, and are constituted by, for example, a semiconductor (for example, silicon) containing impurities.

The insulating film IN2 includes an interelectrode insulating film IN2a, a charge accumulation film IN2b, and a tunnel insulating film IN2c. The interelectrode insulating film IN2a is constituted by, for example, silicon oxide ($SiO_2$). The charge accumulation film IN2b is formed on the interelectrode insulating film IN2a. The charge insulating film IN2b accumulates charges and is constituted by, for example, silicon nitride (SiN). The tunnel insulating film IN2c is formed on the charge accumulation film IN2b. The tunnel insulating film IN2c is constituted by, for example, silicon oxide. A cell current flowing through the semiconductor pillar SP changes according to potentials of the word lines WL and a number of carriers in the charge accumulation film IN2b, and the cell transistor MTr stores data in a non-volatile manner by using the cell current.

The plurality of memory units MU (memory string MS and selection gate transistors SSTr and SDTr) that are lined up along the row direction and share word lines WL, and the selection gate lines SGDL and SGSL constitute one unit, which is referred to as a string.

Figure 5:
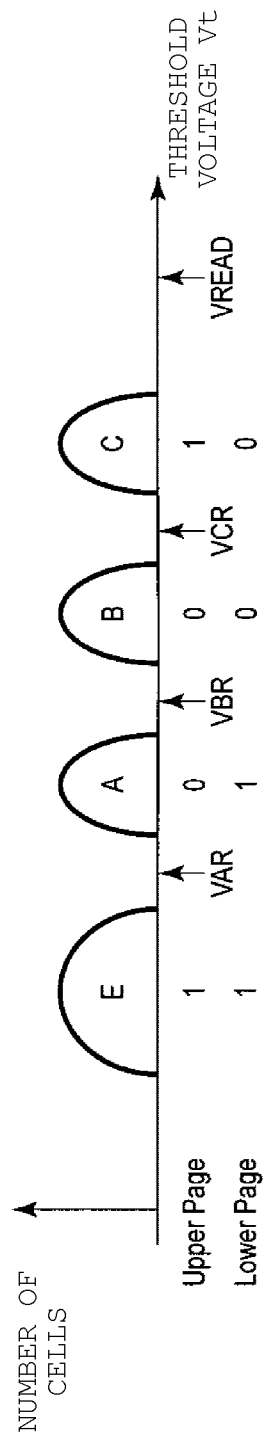
FIG. 5 is a diagram showing a relationship between a state of a cell transistor and the corresponding data stored therein according to the first embodiment.

FIG. 5 shows an example of a relationship between a state of the cell transistor and the corresponding data stored therein according to the first embodiment. In particular, FIG. 5 shows an example in which one cell transistor MTr holds 2 bits of data. In order to store data of 2 bits per cell, the cell transistor MTr can have four variable threshold voltages. The cell transistor MTr is controlled so as to have a desired threshold voltage Vt through the control of the amount of carriers in the charge accumulation film IN2b. In practice, even in case of a plurality of the cell transistors MTr to which the same threshold voltage Vt is applied, due to a variation in the characteristic between the cell transistors MTr, the threshold voltage Vt varies to thereby have a distribution as shown in FIG. 5. A distribution E of the lowest voltage is obtained by an erasing process performed on the cell transistor MTr. A distribution A to a distribution C are obtained by a writing process performed on the cell transistor MTr.

In order to store data of 2 bits per cell, 2 bits are associated with two page addresses, respectively. That is, data of a lower page and data of an upper page are held by one memory cell. As shown in FIG. 5, for example, data "1" of the lower page corresponds to the distribution E and the distribution A, and data "0" of the lower page corresponds to the distribution B and the distribution C. Data "1" of the upper page corresponds to the distribution E and the distribution C, and data "0" of the upper page corresponds to the distribution A and the distribution B.

Based on such an association, with regard to bits of the lower page, it is possible to determine whether any data of "1" and "0" is held by reading through the application of a voltage VBR to the word line WL. That is, when the cell transistor MTr having a threshold voltage included in the distribution E or the distribution A receives the voltage VBR in the word line WL, the cell transistor is turned on. As a result, the cell current flows toward the source line SL through the cell transistor MTr from the bit line BL. On the other hand, even if the cell transistor MTr having a threshold voltage included in the distribution B or the distribution C receives the voltage VBR in the word line WL, the cell transistor is not turned on, and thus the cell current does not flow. Such a difference in the cell current is detected by the sense amplifier 3a, and it is determined whether the cell transistor MTr to be read holds data "0" or data "1" in the lower bit.

With regard to bits of the upper page, data is identified by carrying out a desired operation in the data circuit and page buffer 3 with respect to the cell current that flows when voltages VAR and VCR are applied to the word line WL. That is, it is determined that the cell transistor MTr having a threshold voltage between the voltage VAR and the voltage VCR holds data "0" in the upper bit, and it is determined that the cell transistor MTr having a threshold voltage that is lower than the voltage VAR or higher than the voltage VCR holds data "1" in the upper bit. A voltage VREAD is a voltage that causes the cell transistor MTr to be turned on, regardless of holding data thereof.

Figure 6:
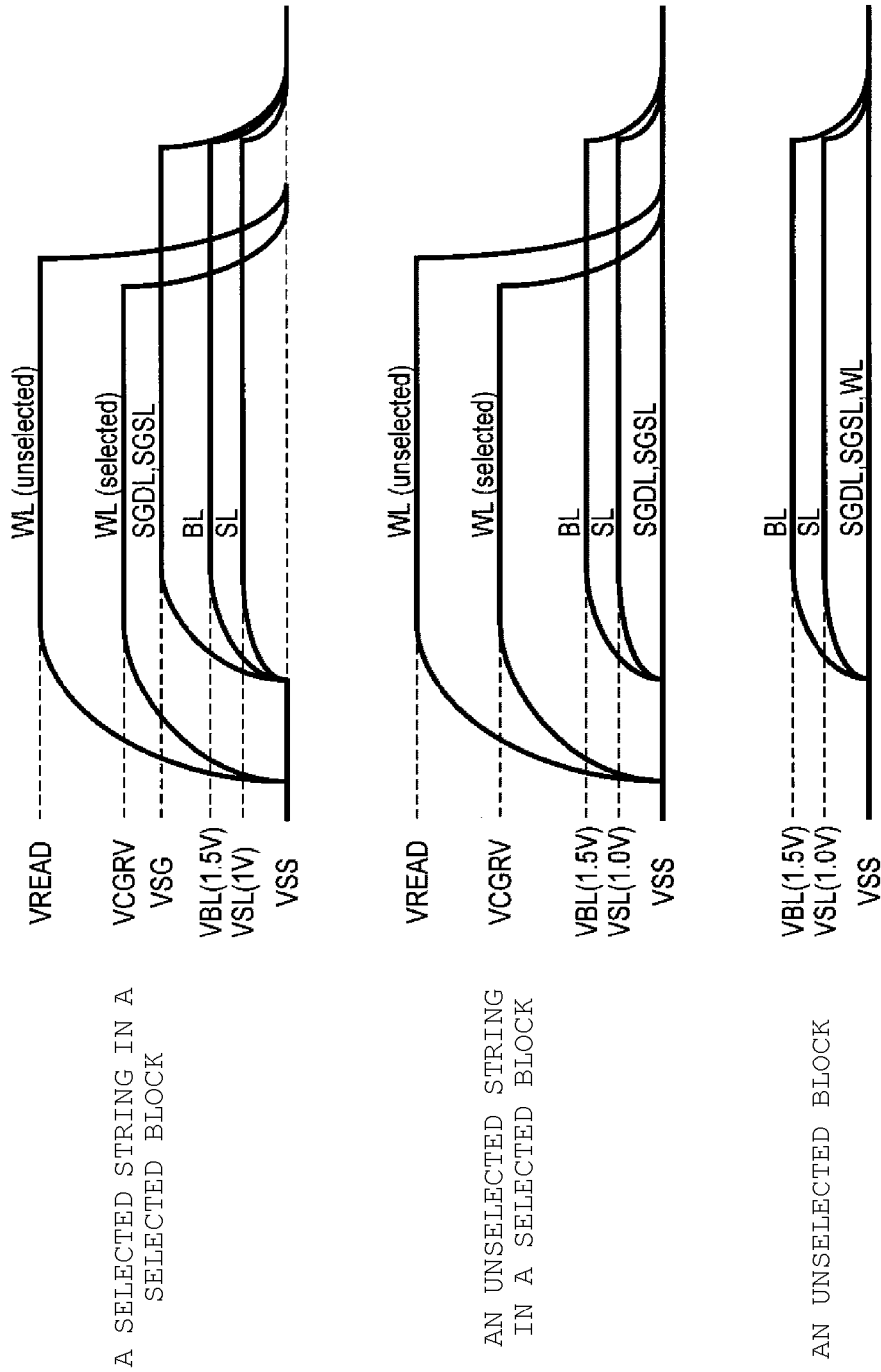
FIG. 6 is a diagram showing a bias state during reading according to the first embodiment.

Next, biasing during reading of the semiconductor memory device 10 will be described. During reading, three types of bias states shown in FIG. 6 occur. A first stage shows biasing in a string including a selected memory cell, that is, a selected string in a selected block. A read voltage VCGRV is applied to a selected word line WL, and a read pass voltage VREAD is applied to word lines other than the selected word line. The read voltage VCGRV is any voltage that is determined according to holding data of the cell transistor from which VAR, VBR, and VCR of FIG. 5 are read. A voltage VSG that sufficiently causes the transistors SDTr and SSTr to be turned on is applied to the selection gate lines SGDL and SGSL. Voltages VBL and VSL (for example, 1.5 V and 1 V, respectively) for reading are applied to the bit line BL and the source line SL, respectively.

A second stage shows biasing in strings other than the selected strings in the selected block. Since the word lines WL are shared in one block, the word lines WL serve as the voltage VCGRV or VREAD even in the unselected string. On the other hand, for example, 0 V is applied to the selection gate lines SGDL and SGSL, and thus the transistors SDTr and SSTr are turned off.

A third stage shows biasing in the unselected block. All blocks other than one selected block in one plane are set to be in this state. The word lines WL are in a floating state because biasing is not applied thereto. In addition, a voltage for sufficiently cutting off the transistors SDTr and SSTr, for example, 0 V is applied to the selection gate lines SGDL and SGSL in order to prevent a flow of leak current from the bit line BL.

Next, a circuit will be described for embodying the semiconductor memory device 10 having properties of FIGS. 1 to 6. First, for the purpose of illustration, a circuit capable of embodying the semiconductor memory device 10 will be described with reference to FIG. 7.

Each memory cell array includes k blocks MB. In the drawing, two blocks are shown. The bit lines BL0 to BLm (for example, m is 64K−1) extend across all the blocks MB in the same plane. The bit lines BL are connected to the data circuit and page buffer 3, and particularly, to one corresponding sense amplifier 3a of the data circuit and page buffer 3.

As mentioned above, in each block MB, a plurality of the memory strings MS (lined up along row direction) that are connected to the bit lines BL0 to BLm share the word lines WL0 to WLn. Here, i+1 strings are provided in each block MB. In the drawing, two strings are shown. The selection gate lines SGDL0 to SGDLi on the drain side and the selection gate lines SGSL0 to SGSLi on the source side are respectively provided for the string 0 to the string i. In the cell transistors MTr in the string which are lined up along the row direction and are respectively connected to the bit lines BL0 to BLm, a storage space of the cell transistors MTr that share the word lines constitutes one or a plurality of pages. The page may be a part of the storage space of the cell transistors MTr that share the word lines, in the cell transistors MTr in the string which are lined up along the row direction and are respectively connected to the bit lines BL0 to BLm.

The row decoder 2 includes a plurality of block decoders 2a and a plurality of transfer transistor groups 2b. One block decoder 2a and one transfer transistor group 2b are provided for each block MB. The transfer transistor group 2b includes n WL transfer transistors WDTr, i+1 SGDL transfer transistors SDDTr, and i+1 SGSL transfer transistors SSDTr. The word lines WL0 to WLn are respectively connected to CG lines CG0 to CGn through one corresponding transistor WDTr. Selection gate lines SGDLX and SGSLX for a string X (X is an integer of 0 to i) are connected to an SGD line SGDX and an SGS line SGSX through the corresponding transistors SDDTr and SSDTr, respectively. Gates of all the transistors WDTr, SDDTr, and SSDTr in a block MBY (Y is an integer of 0 to k) receive a block selection signal BLK-SELY from a block decoder 2aY for a block Y. A voltage from the core driver 9 is transferred to the selection gate lines SGDL and SGSL and the word line WL of the selected block MB through the transistors SDDTr, SSDTr, and WDTr. The CG line and the SG lines SGD and SGS receive the voltage from the core driver 9. As mentioned above, a distinction between the selection and the non-selection of the string is performed by using the voltage VSG that is applied to the selection gate lines SGDL and SGSL in the selected string and a voltage VSS (=0 V) that is applied to the selection gate lines SGDL and SGSL in the unselected string. For this reason, the core driver 9 is configured to be capable of applying an independent voltage to each string.

The selection gate line SGDL receives an unselected voltage (for example, VSS) through each transistor UDTr. The selection gate line SGSL receives the voltage SGDS through each transistor USTr. Gates of all the transistors UTr in the block MBY receive a block selection signal /BLKSELY from the block decoder 2aY. A sign "/" denotes a negative logic.

The block decoder 2a receives the block address signal from the address and command register 7. The block decoder 2a, which is selected on the basis of the block address signal, outputs a desired high level to a signal BLKSEL, and the block MB that received the desired high level on BLKSEL is selected. The transistors UDTr and USTr in the selected block MB are turned off because VSS is output to /BLKSEL in the selected block. On the other hand, in the unselected block MB, the transistors UDTr and USTr receive another desired high level on their /BLKSEL to thereby be turned on, and the voltage SGDS is applied to the selection gate lines SGDL and SGSL and the word lines WL. The transistors UDTr and USTr for transferring an unselected voltage may be independently controlled.

Figure 8:
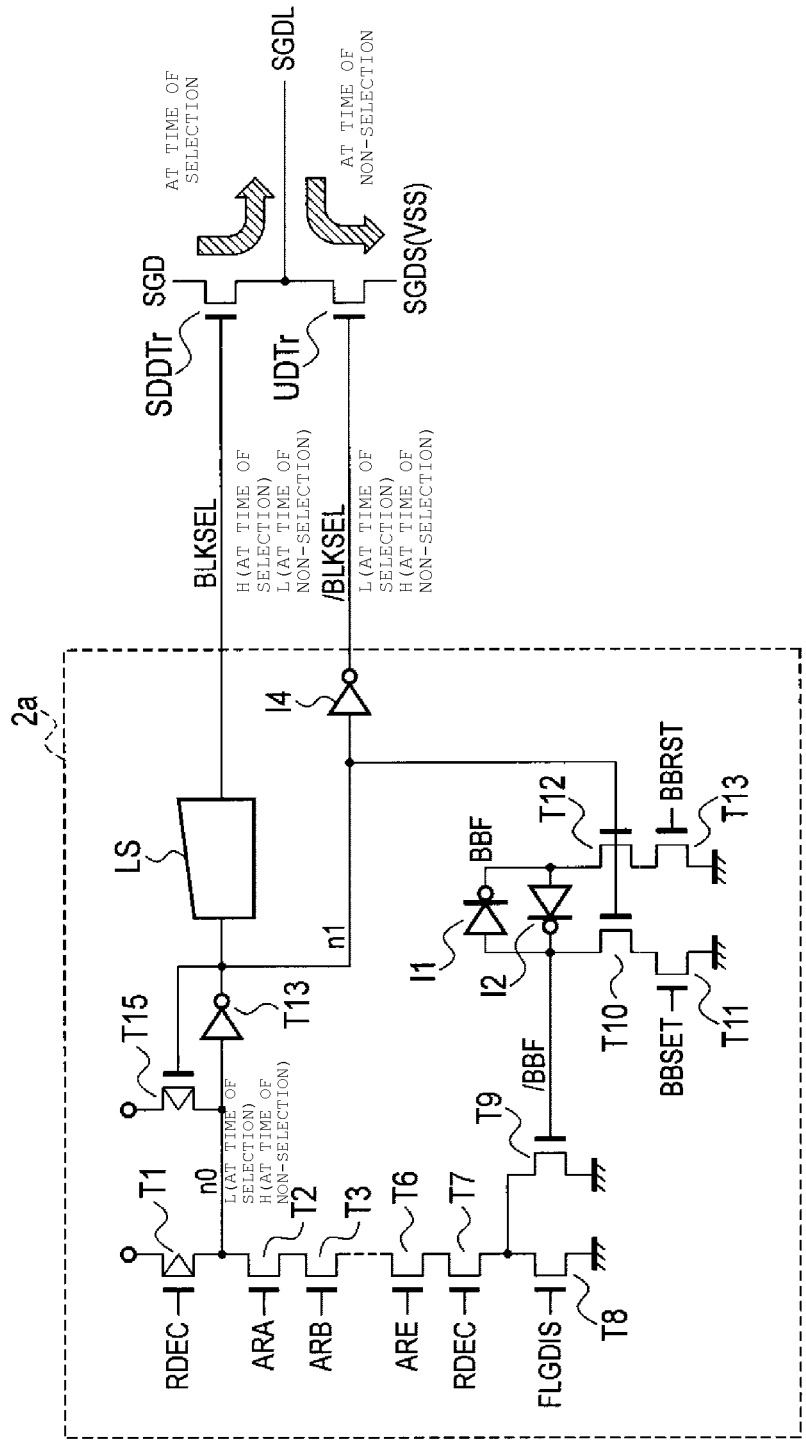
FIG. 8 is a circuit diagram of a block decoder provided for reference.

The block decoder 2 provided for illustration is shown in FIG. 8. As shown in FIG. 8, a P-type metal oxide semiconductor field effect transistor (MOSFET) transistor T1 and N-type MOSFETs T2 to T7 are connected in series between a power source potential (VDD) and a ground potential (VSS). A connection node of the transistors T1 and T2 is referred to as a node n0. The transistors T1 and T7 receive a signal RDEC in the gates thereof. The signal RDEC is an enable signal of block address decoding, and is supplied from, for example, the control circuit 5 and the core driver 9. The signal RDEC is at a low level while the signal disables the block decoder 2a, and is set to be at a high level (valid logic) when the signal enables the block decoder 2a.

The transistors T2 to T6 receive block address signals ARA to ARE, respectively, from the address and command register 7 in the gates thereof. In the drawing, when the transistors T2 to T6 are in the selected block, all the transistors are actually connected so as to be in an on state. The transistor T8 receives a signal FLGDIS in the gate thereof. The signal FLGDIS is at a low level normally, and thus the transistor T8 is normally turned off. The signal FLGDIS is supplied from, for example, the control circuit 5 and the core driver 9. The signal FLGDIS is set to be at a high level when a decoder is allowed to be selected, regardless of control that is relevant to a bad block described below.

As will be described below, a transistor T9 is turned on or turned off according to whether or not the block MB corresponding to the block decoder 2a is a bad block. A gate of the transistor T9 is referred to as a node /BBF, receives a signal /BBF, and is connected to an input of a clocked inverter I1 and an output of a clocked inverter I2. The clocked inverters I1 and I2 are connected crosswise to each other, and constitute bad block latch (first latch). Here, n-type MOSFETs T10 and T11 are connected in series between the node /BBF and the ground potential. Here, n-type MOSFETs T12 and T13 are connected in series between an input (node BBF) of the inverter I2 and the ground potential. Gates of the transistors T10 and T12 are connected to a node n1. The transistors T11 and T13 receive signals BBSET and BBRST, respectively, in the gates thereof. The signals BBSET and BBRST set and reset the bad block latch, respectively. The set and reset bad block latch (first latch) hold a low level and a high level in the node /BBF, respectively. When the node n1 is at a high level and a signal RFRST is at a high level, the node BBF is changed to a low level, the first latch is reset (node /BBF is changed to a high level), and the transistor T9 is turned on. On the other hand, when the node n1 is at a high level and a signal BBRST is at a high level, the first latch is set (node /BBF is changed to a low level), and the transistor T9 is turned off. In the selected block, during decoding, a current flows through paths of the transistors T1 to T6 and T9.

The node n0 is connected to a power source potential through the transistor T15, and is connected to the node n1 through an inverter I3. The node n1 is connected to a gate of the transistor T15, and is connected to a level shifter LS. The level shifter LS shifts the level of the node n1 to generate the signal BLKSEL. Further, the node n1 provides the signal /BLKSEL through an inverter I4. The signal BLKSEL is input to all the transistors SDDTr and SSDTr in the corresponding block. The signal /BLKSEL is input to all the transistors UDTr and USTr in the corresponding block. In the drawing, only one pair of transistors SDDTr and UDTr connected to one selection gate line SGDL are shown.

Usually, the signal RDEC is at a low level. For this reason, the transistors T1 and T2 are turned on and are turned off, respectively. Therefore, the node n0 is precharged to the power source potential. The transistor T15 is also turned on by the high level of the node n0 and the low level of the node n1.

When decoding is performed, first, desired block address signals ARA to ARE are applied. Thereafter, the signal RDEC is changed to a high level. The signal RDEC maintains the high level for the duration of the decoding, and thus the transistor T6 maintains an on state in the meantime.

In the decoder (selected decoder) 2a that is targeted by a block address, all the transistors ARA to ARE are turned on. In addition, the transistor T9 is also turned on in a normal block (not a bad block). Thus, a potential of the node n0 is discharged through the transistors T2 to T6 and T9. Since the transistor T15 is designed to have a size that does not obstruct the discharge, the potential of the node n0 sufficiently decreases, and thus the node n1 that is changed to a high level turns off the transistor T15. That is, the state where the node n0 is changed to a low level and the node n1 is changed to a high level is a state where a block is selected by the matching of the block address.

On the other hand, when the bad block latch (inverters I1 and I2) is set, the transistor T9 maintains an off state. Thus, even though the block address is matched, the node n0 maintains a high level. That is, the block maintains an unselected state. Meanwhile, for example, the bad block latch is set when a power source of the semiconductor memory device 10 is turned on.

In the unselected block, the node n1 is at a low level. Thus, the signals BLKSEL and /BLKSEL are at a low level and a high level, respectively, and the transistors SDDTr and UDTr are turned off and turned on, respectively. As mentioned above, during reading, for example, the signal SGDS is set to be VSS, and thus the selection gate line SGDL is discharged to the VSS.

In the selected block, the signal /BLKSEL is changed to a low level, and the transistor UDTr is turned off. On the other hand, the signal BLKSEL is changed to a high level in which the signal is converted to a desired voltage by the level shifter LS, to thereby turn on the transistor SDDTr. As a result, the selection gate line SGDL receives a voltage of the SGD line SGD.

With the progress of miniaturization of a semiconductor memory device, a large number of elements are laid out in a small area, and thus a short-circuit may occur. A short-circuit may occur in various places. For example, the short-circuit may include a short-circuit between the word lines WL, a short-circuit between the word line WL and the selection gate lines SGDL and SGSL, a short-circuit between the bit lines BL, a short-circuit between the selection gate line SGDL and the bit line BL, a short-circuit between the selection gate line SGSL and the source line SL, and the like. Among these, for example, with regard to the short-circuit between the word lines WL, the block MB that has those short-circuits is controlled so as not to be selected, or is replaced by block redundancy. The short-circuit between the bit lines BL is ordinarily replaced by column redundancy in units of desired bit line groups (for example, columns) including the bit lines.

With regard to the short-circuit between the selection gate line SGDL and the bit line BL and the short-circuit between the selection gate line SGSL and the source line SL, the block MB that has these short-circuits is also treated as a bad block because a memory cell transistor MTr that is selected by the selection gate lines SGDL and SGSL is not normally operated. This point will be described using FIG. 7.

Figure 7:
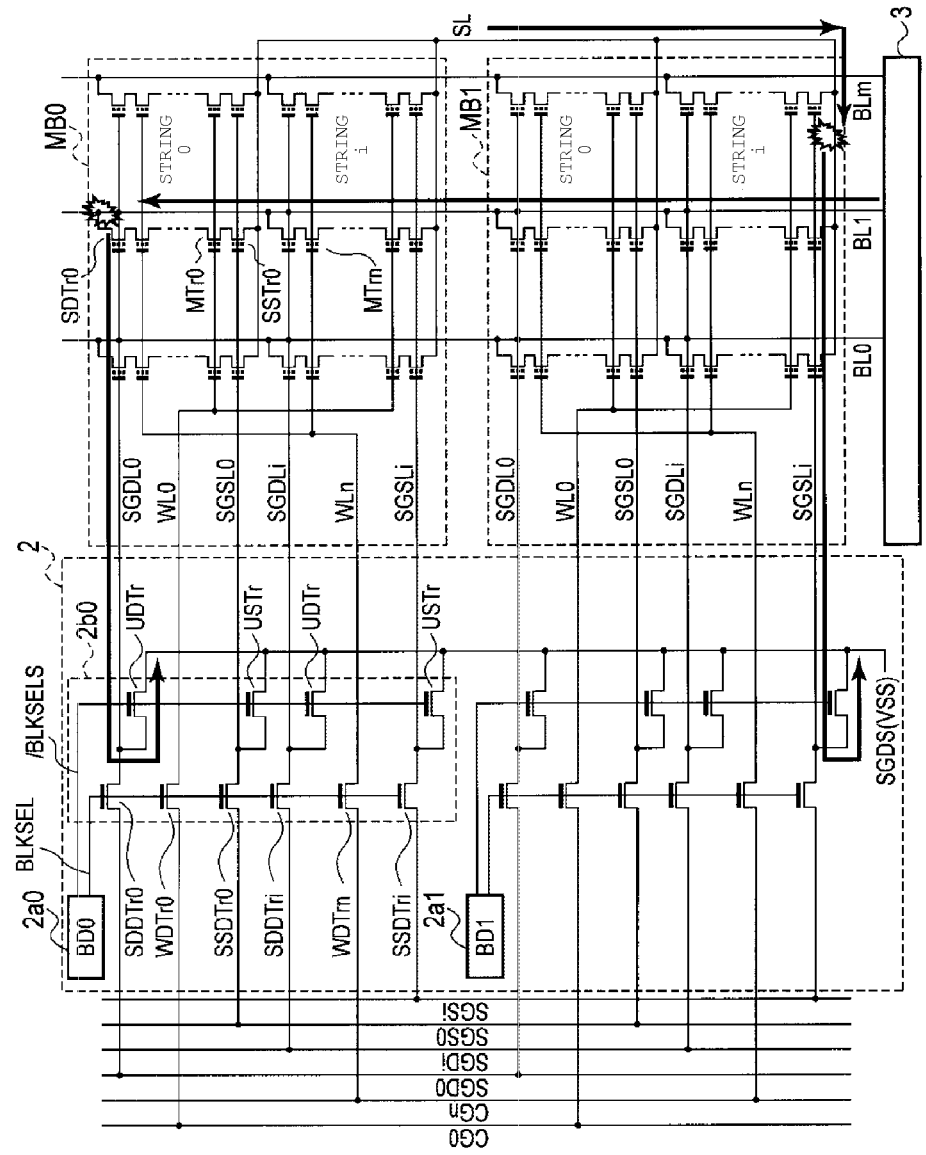
FIG. 7 is a circuit diagram of a semiconductor memory device provided for reference.

FIG. 7 shows a short-circuit between a bit line BL1 and a selection gate line SGDL0 of a block MB0, and a short-circuit between the source line SL and a selection gate line SGSLi of a block MB1. A block that has the short-circuit between the selection gate line SGDL and the bit line BL is treated as a bad block. That is, this block is always not selected, and is controlled similarly to the unselected block. Specifically, the unselected voltage (VSS) is applied to the selection gate line SGDL0 through the transistor UDTr.

When a short-circuit occurs between the selection gate line SGDL and the bit line BL, the bit line BL is discharged to 0 V through a place where the short-circuit occurs. It is not known where the short-circuit between the bit line BL and the selection gate line SGDL occurs in the bit line BL and the selection gate line SGDL. In addition, a leak current value to be estimated is larger in the short-circuit between the source line SL and the selection gate line SGSL than that in the short-circuit between the bit line BL and the selection gate line SGDL. For this reason, there is a possibility of the influence of the short-circuit between the source line SL and the selection gate line SGSL on the operations of other normal blocks through a potential drop of the source line SL, which results is of a great concern. In addition, with regard to the short-circuit involving the bit line BL, it is possible to eliminate the influence of the bit line BL short-circuited on the memory cell array 1 under the control of the sense amplifier 3a, but the source line SL is common within the memory cell array 1, and thus a particular countermeasure cannot be implemented in a faulty place. Therefore, an effective countermeasure against the short-circuit between the source line SL and the selection gate line SGSL is required.

Figure 9:
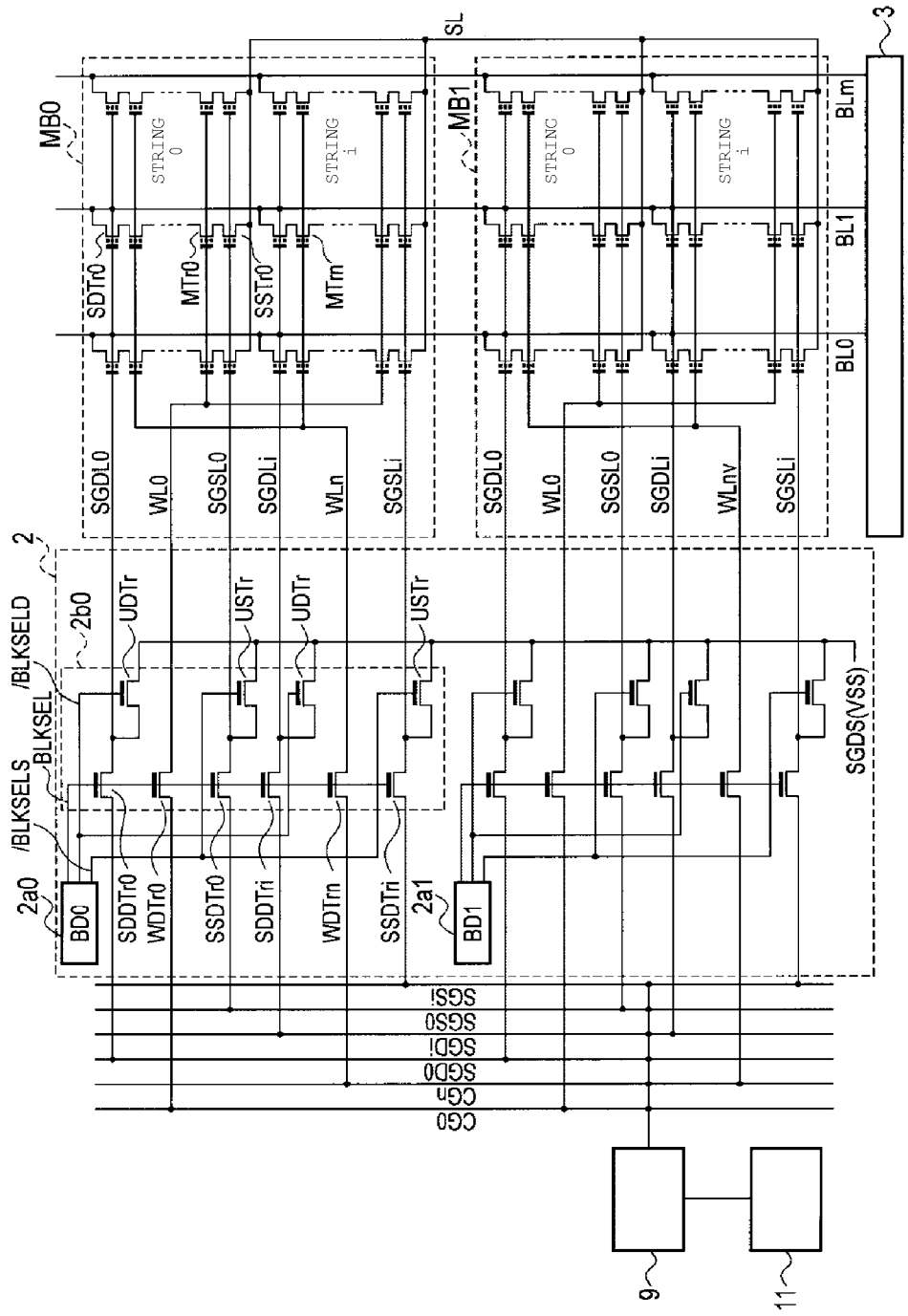
FIG. 9 is a circuit diagram of the semiconductor memory device according to the first embodiment.

Hereinafter, a circuit of the semiconductor memory device 10 according to the first embodiment will be described with reference to FIG. 9. FIG. 9 is a circuit diagram of the semiconductor memory device according to the first embodiment. As shown in FIG. 9, each block decoder 2a supplies signals /BLKSELD and /BLKSELS to gates of the transistors UDTr and USTr, respectively, in the block MB in which the block decoder 2a has charge of decoding.

As a method of detecting the short-circuit between the selection gate line SGSL and the source line SL, a method of directly detecting a leak current from the selection gate line SGSL is most reliable. When a short-circuit occurs, a leak current flows around the short-circuit. For this reason, the leakage detection circuit 11 is configured to apply a voltage through the core driver 9 and to be capable of detecting a leak current. The leakage detection circuit 11 instructs the core driver 9 to apply a voltage for detecting a leak current so that it can detect the leak current. For example, the detection of the leak current is performed by selecting an arbitrary block MB and string. When the selection gate lines SGSL of all the blocks MB are tested, the testing is performed while sequentially changing a block address and a string address.

Figure 10:
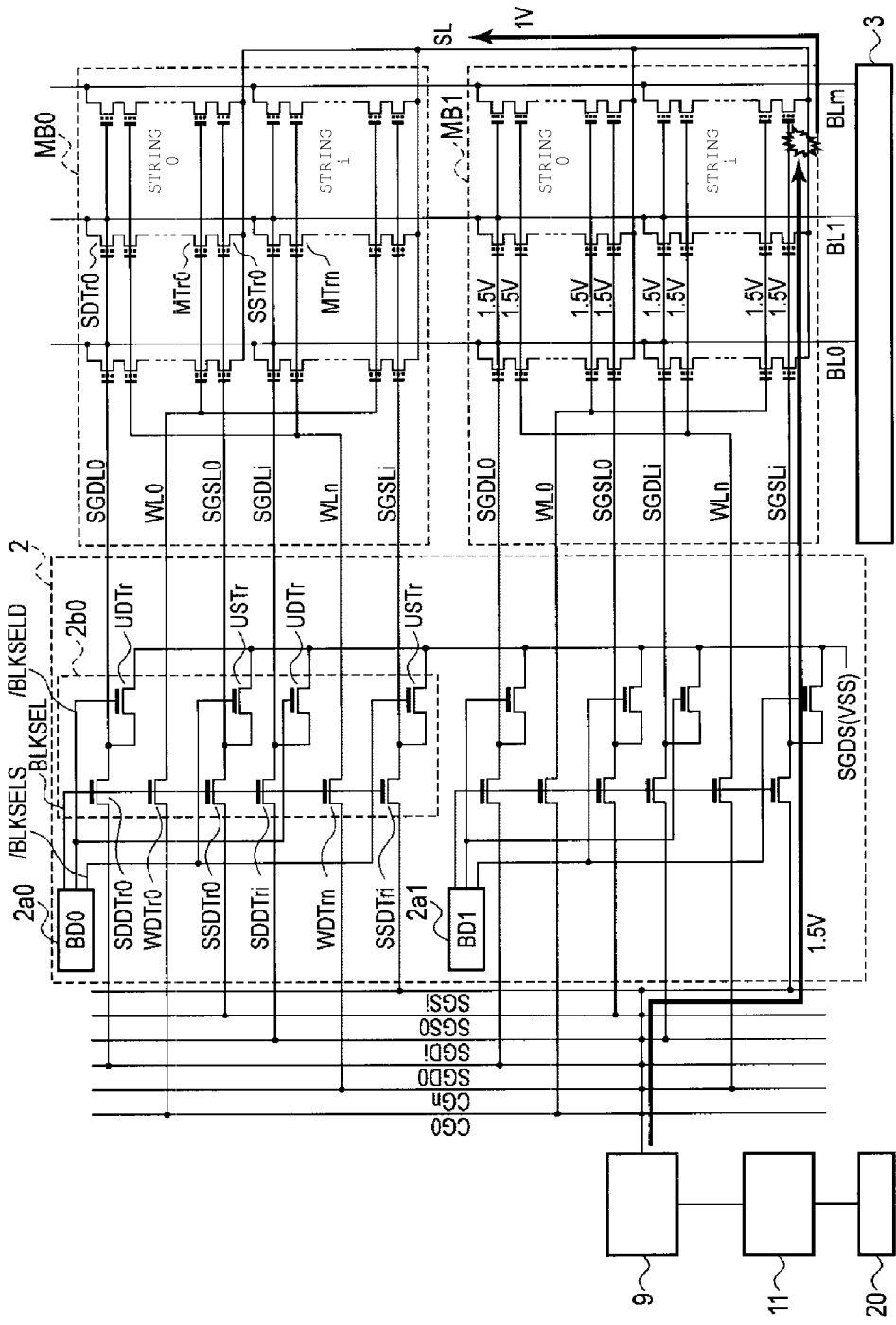
FIG. 10 is a diagram showing one state of the semiconductor memory device according to the first embodiment.

FIG. 10 shows a state where the selection gate line SGSLi of the block MB1 is to be evaluated in the first embodiment. A voltage for detecting a leak current, for example, 1.5 V, is applied to the selection gate line SGSLi, and 1.5 V is also applied to all the word lines WL and all other selection gate lines SGDL and SGSL in the same block MB1. When the voltage is lower than 1.5 V, leakage to the word lines WL and the selection gate lines SGSL in the same block is viewed from the selection gate line SGSLi to be evaluated. For this reason, the voltages of the word lines WL and the selection gate lines SGDL and SGSL in the same block are required to be the same as that of the selection gate line SGSLi.

On the other hand, a voltage lower than 1.5 V that is applied to the selection gate line SGSLi, for example, 1 V is applied to the source line SL. If a short-circuit occurs between the selection gate line SGSLi and the source line SL, a current flows toward the source line SL from the selection gate line SGSLi. The leakage detection circuit 11 detects the presence of a leak current by comparing to a current having an arbitrary set value, for example, equal to or more than 0.5 µA, as a threshold value.

When the leakage detection circuit 11 determines that the short-circuit occurred between the selection gate line SGSL and the source line SL, address information of the block MB that includes the selection gate line SGSL is stored in a tester or a memory 20 of the semiconductor memory device 10. The memory 20 stores the address information in a non-volatile manner, and can be implemented by, for example, a ROM area prepared within a memory cell array. The ROM area holds data for controlling the semiconductor memory device 10, a parameter, and the like.

Figure 11:
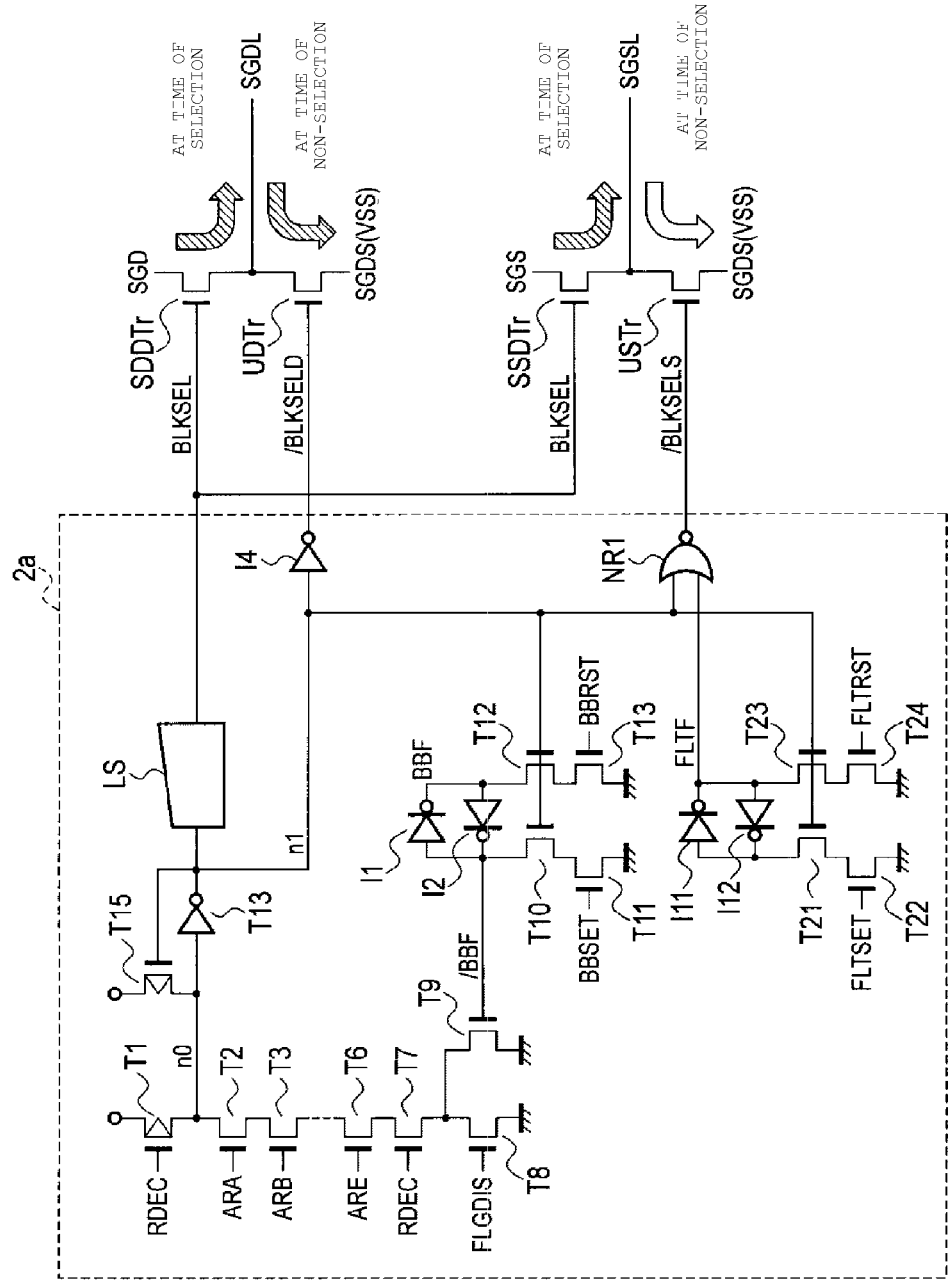
FIG. 11 is a circuit diagram of a block decoder according to the first embodiment.

FIG. 11 is a circuit diagram of the block decoder according to the first embodiment. As shown in FIG. 11, the block decoder 2a includes clocked inverters I11 and I12, n-type MOSFETs T21 to T24, and a NOR gate NR1, in addition to the elements and the connection of FIG. 8. In the example of FIG. 8, both the transistor SDDTr and the transistor SSDTr are controlled by the signal BLKSEL, and both the transistors UDTr and USTr are controlled by the signal /BLKSEL. On the other hand, in FIG. 11, the transistors UDTr and USTr are controlled by the signals /BLKSELD and /BLKSELS, respectively. The transistors SDDTr and SSDTr are controlled by the signal BLKSEL.

Inverters I11 and I12 are connected crosswise to each other, and constitute floating control latches (second latches). When a node described below of the block MB that is decoded by the decoder 2a that includes the latch is required to be floated, the floating control latch is set. The transistors T21 and T22 are connected in series between an input of the set inverter I11 and a ground potential. The transistors T23 and T24 are connected in series between an input node FLTF of the inverter I12 and a ground potential. Gates of the transistors T21 and T23 are connected to the node n1. The transistors T22 and T24 receive signals FLTSET and FLTRST, respectively, in the gates thereof. The signals FLTSET and FLTRST set and reset the floating control latches (second latches), respectively. The set and reset floating control latches (second latches) hold a high level and a low level, respectively, in the node FLTF. Further, the node n1 is connected to a first input of the NOR gate NR1. A second input of the NOR gate NR1 is connected to the node FLTF. The NOR gate NR1 outputs a signal /BLKSELS. FIG. 11 representatively shows only one of i+1 selection gate lines SGDL and only one of i+1 selection gate lines SGSL in the block MB that is decoded by the decoder 2a. In response to this, only a pair of transistors SDDTr and UDTr for one selection gate line SGDL and only a pair of transistors SSDTr and USTr for one selection gate line SSDL are shown. The signal BLKSEL is actually supplied to all the transistors SDDTr and SSDTr in the block MB, the signal /BLKSELD is supplied to all the transistors UDTr in the block MB, and the signal /BLKSELS is supplied to all the transistors USTr in the block MB. All the transistors SDDTr and SSDTr act in a similar manner based on the level of the signal BLKSEL, all the transistors UDTr act in a similar manner based on the level of the signal /BLKSELD, and the transistors USTr act in a similar manner based on the level of the signal /BLKSELS.

Figure 12:
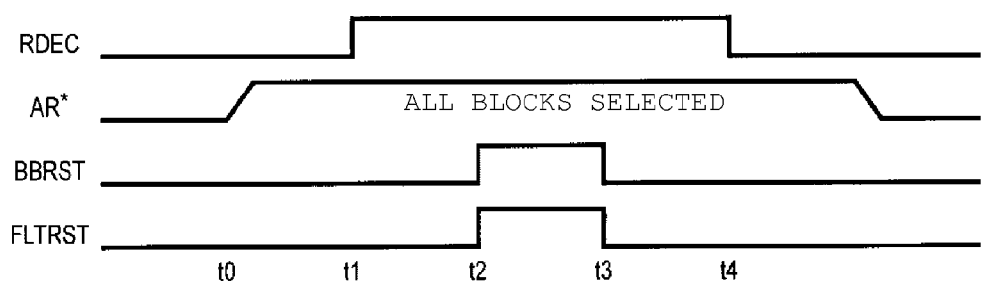
FIG. 12 is a timing chart for resetting a latch according to the first embodiment.
Figure 13:
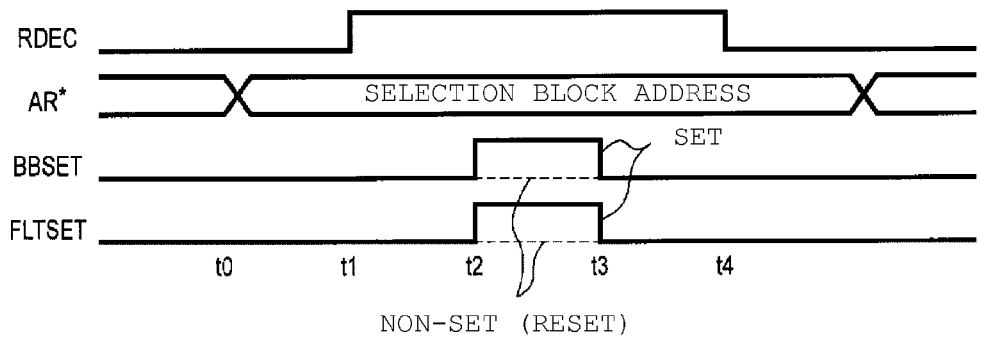
FIG. 13 is a timing chart for setting a latch according to the first embodiment.

Next, the control of the bad block latch and the floating control latch will be described with reference to FIGS. 12 and 13. FIG. 12 is a timing chart for resetting the bad block latch and the floating control latch according to the first embodiment. FIG. 13 is a timing chart for setting the bad block latch and the floating control latch according to the first embodiment. As shown in FIG. 12, for example, the control circuit 5 supplies the address signals ARA to ARE (AR) of the blocks MB that include the latches to be reset, to the decoder 2a through the core driver 9. When the latches of all the blocks MB are reset, the control circuit 5 controls the address signals ARA to ARE to be changed to a high level in all the blocks MB at a time t0. FIG. 12 shows an example of resetting in all the blocks MB. Next, the control circuit 5 enables the decoder 2a by setting the signal RDEC to be at a high level at a time t1. Next, the control circuit 5 sets the signal BBRST to be at a high level in order to reset the bad block latch, and sets the signal FLTRST to be at a high level in order to reset the floating control latch, from a time t2 to a time t3. When only one of the two latches is desired to be reset, only the signal BBRST or the signal FLTRST of the corresponding latch is set to be at a high level. Subsequently, the control circuit 5 disables the decoder 2a by setting the signal RDEC to be at a low level at a time t4, and then the address signal AR is set to be at a low level. The resetting of the latch as shown in FIG. 12 is performed at a timing, for example, before or after an initial setting operation (during power-on reading) until the semiconductor memory device 10 is changed to a usable state.

As shown in FIG. 13, when the latch is set, the control circuit 5 sets the signal BBSET or (and) FLTSET corresponding to the latch to be set to be at a high level, instead of the signals BBRST and FLTRST of FIG. 12 from a time t2 to a time t3. Two latches are set or reset according to states of the block MB. That is, the control circuit 5 obtains information regarding whether each block MB is a bad block and information regarding whether the selection gate line SGSL is desired to be floated. These pieces of information are stored in the memory 20 in a non-volatile manner. With respect to a normal block MB, the control circuit 5 sets both the signals BBSET and FLTSET to be at a low level. With respect to a block MB which is a bad block but is not to be floated, the control circuit 5 sets the signals BBSET and FLTSET to be at a high level and a low level, respectively. With respect to a block MB which is a bad block and is to be floated, the control circuit 5 sets both the signals BBSET and FLTSET to be at a high level. In this manner, when the block MB that is decoded by the decoder 2a that includes the bad block latch is a bad block, the bad block latch holds a high level. Otherwise, the bad block latch holds a low level. In addition, when the block MB that is decoded by the decoder 2a that includes the floating control latch is to be floated, the floating control latch holds a high level. Otherwise, the floating control latch holds a low level. As mentioned above, when the floating control latch is within the decoder 2a for the block MB that has the short-circuit between the source line SL and the selection gate line SGSL by the leakage detection circuit 11, the latch is set. The setting of the latch as shown in FIG. 13 is performed at a timing, for example, during power-on reading.

Figure 14:
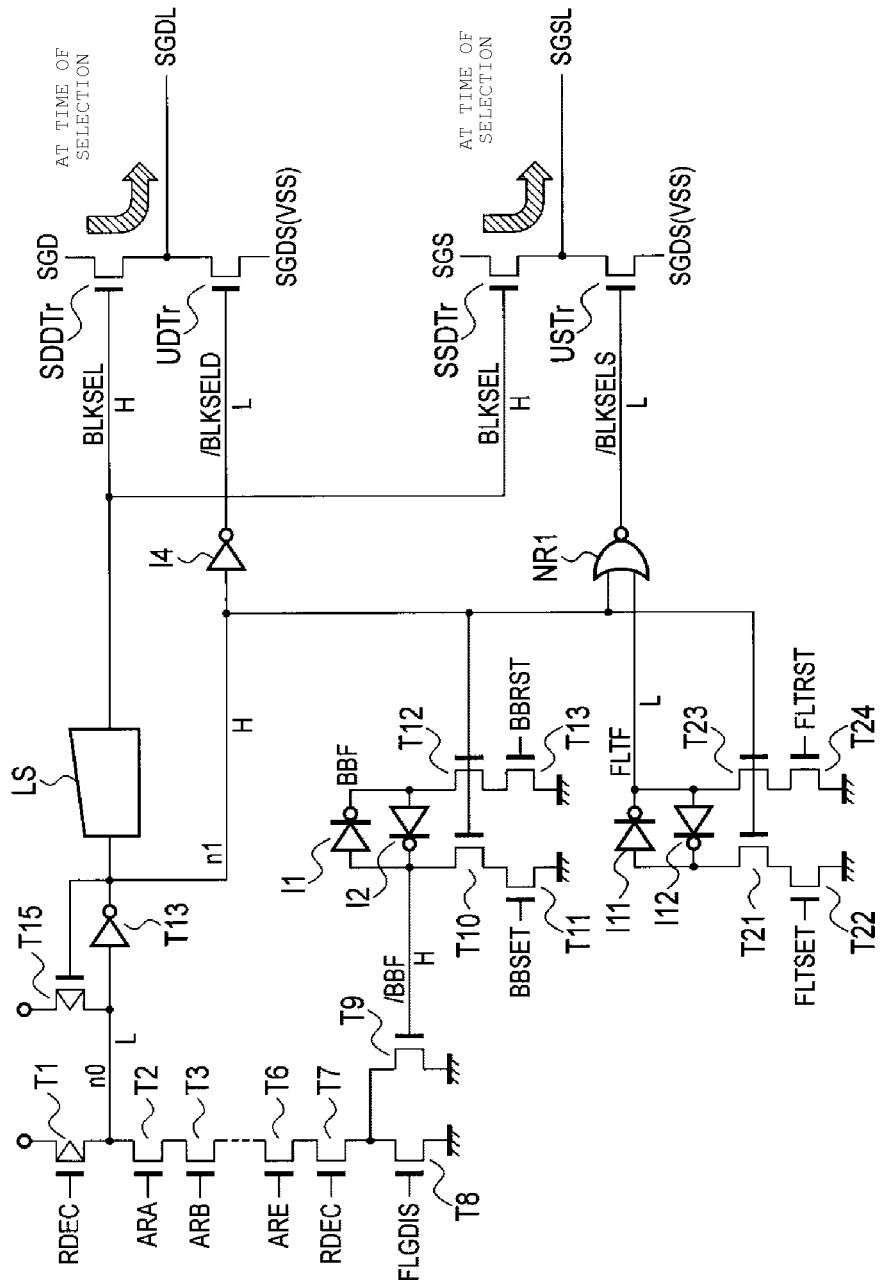
FIG. 14 is a diagram showing one state in the block decoder according to the first embodiment.

Next, operations of the circuit of FIG. 11 will be described with reference to FIGS. 14 to 16. FIG. 14 shows a state of a decoder at the time of the selection of a normal block, according to the first embodiment. As shown in FIG. 14 and as mentioned above, in a normal block, both the bad block latch and the floating control latch are reset. That is, the nodes /BBF and FLTF are at a high level and a low level, respectively. When the node /BBF is at a high level, address decoding can be performed. Thus, when the row address signals ARA to ARE are supplied, the node n0 is changed to a low level. As a result, the signal BLKSEL is changed to a high level, and the signal /BLKSELD is changed to a low level, and thus a potential of the SGD line SGD connected through the transistor SDDTr is transferred to the selection gate line SGDL. In addition, the signal /BLKSELS is changed to a low level, in addition to the signal BLKSEL changed to a high level, and thus a potential of the SGS line SGS connected through the transistor SSDT is transferred to the selection gate line SGSL.

Figure 15:
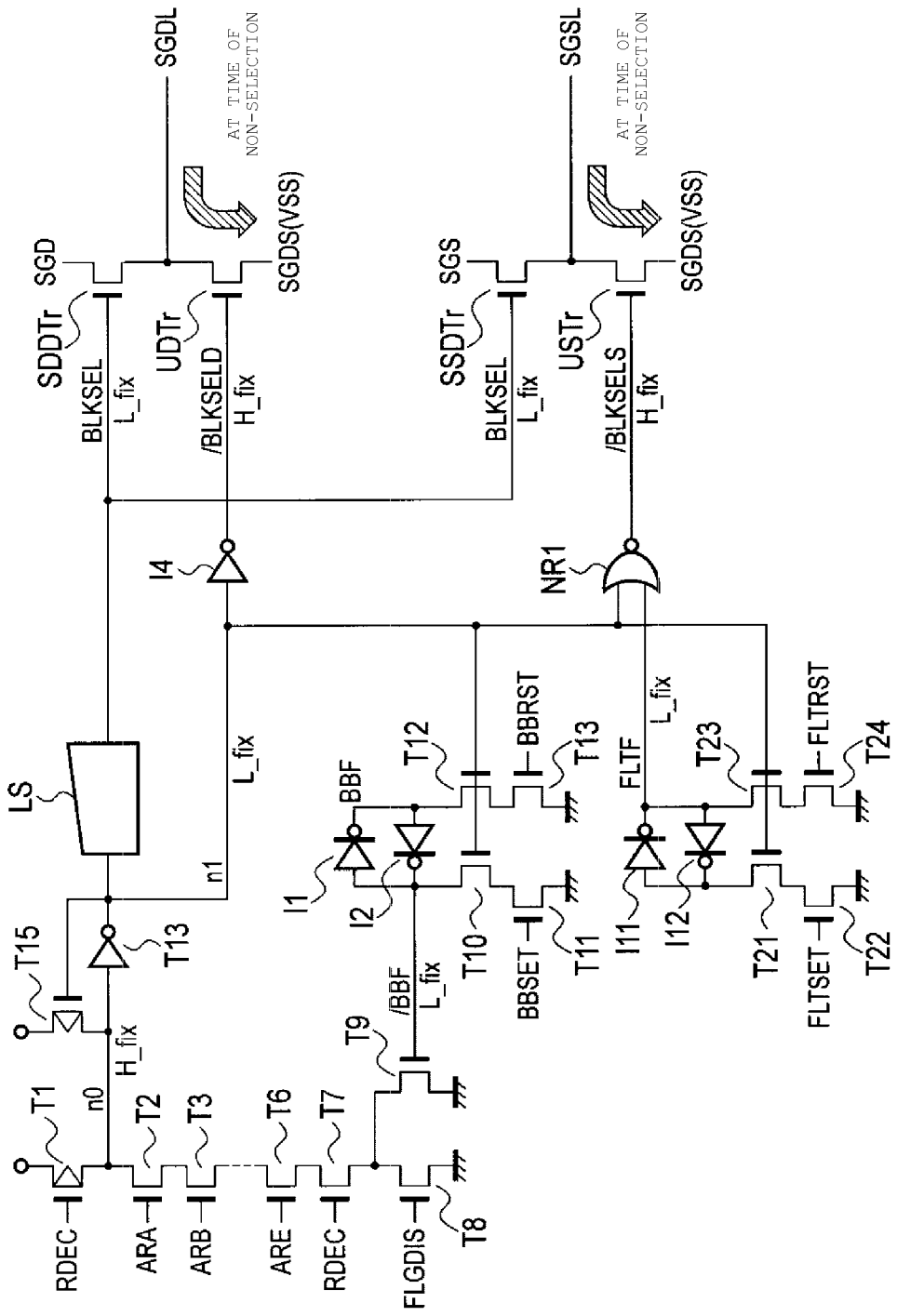
FIG. 15 is a diagram showing one state in the block decoder according to the first embodiment.

FIG. 15 shows a state of a decoder at the time of the selection of a block which is a bad block but is not to be floated, according to the first embodiment. As shown in FIG. 15, in such a block, the bad block latch and the floating control latch are set and reset, respectively. That is, both the nodes /BBF and FLTF are at a low level. When the node /BBF is at a low level, the node n0 maintains a high level, and address decoding cannot be performed. Therefore, the signal BLKSEL maintains a low level, the signals /BLKSELD and /BLKSELS maintain a high level, and the unselected voltage is transferred to the selection gate lines SGDL and SGSL.

Figure 16:
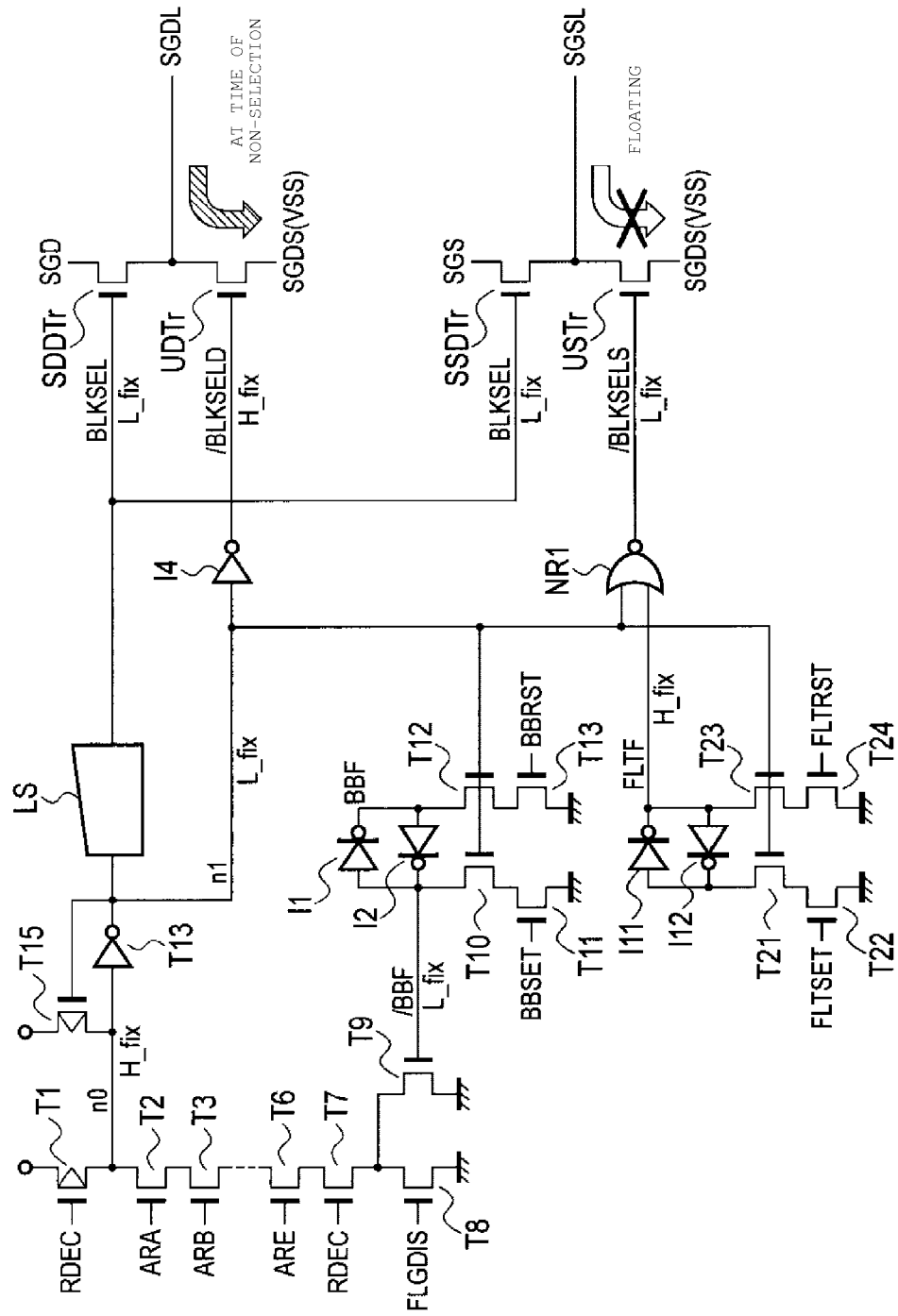
FIG. 16 is a diagram showing one state in the block decoder according to the first embodiment.
Figure 17:
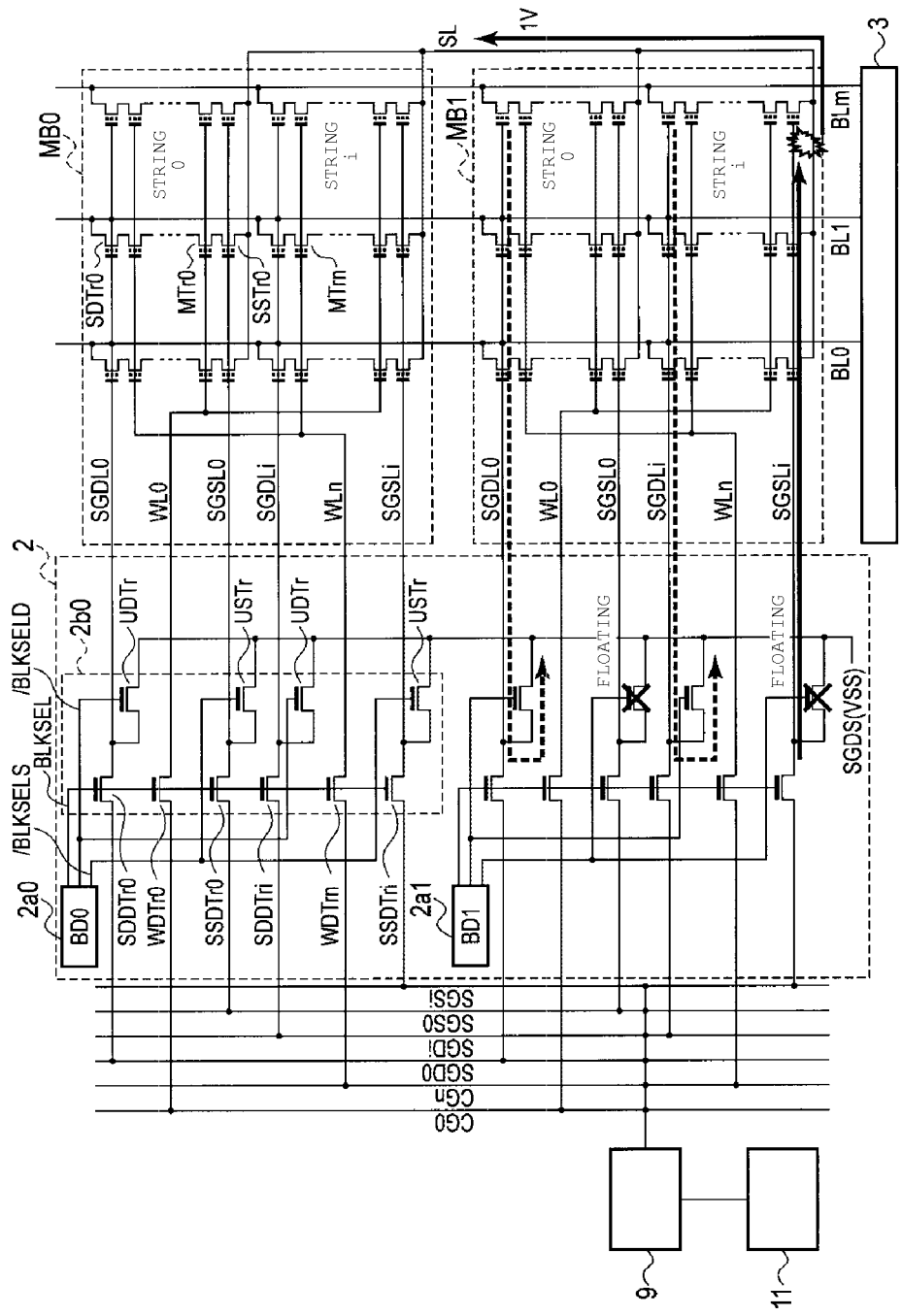
FIG. 17 is a diagram showing one state of the semiconductor memory device according to the first embodiment.

FIG. 16 shows a state of a decoder at the time of the selection of a block which is a bad block and is to be floated, according to the first embodiment. As shown in FIG. 16, in such a block, both the bad block latch and the floating control latch are set. That is, the nodes /BBF and FLTF are at a low level and a high level, respectively. When the node /BBF is at a low level, the node n0 maintains a high level, and address decoding cannot be performed. Therefore, the signal BLKSEL maintains a low level, the signal /BLKSELD maintains a high level, and the unselected voltage is transferred to the selection gate line SGDL. On the other hand, in addition to the signal BLKSEL that is at a low level, when the signal /BLKSELS is changed to a low level, the selection gate line SGSL is changed to a floating state. This state is shown in FIG. 17 with respect to the block MB1. In this manner, in a block MB that has a short-circuit between the source line SL and the selection gate line SGSL, the selection gate line SGSL is set to be in a floating state. For this reason, the source line SL is prevented from being pulled by the unselected voltage (VSS) through the selection gate line SGSL short-circuited to the source line.

A block that has a short-circuit between the source line SL and the selection gate line SGSL is set to be a bad block in principle. However, when a certain block is to be floated, but it can also be said that the block should not be classified as a bad block. In such a block, the bad block latch and the floating control latch are reset and set, respectively. That is, both the nodes /BBF and FLTF are at a high level. In such a block, each memory string MS is cut off only on the bit line side of the source side and the bit line side. For example, such a setting is effective to save a block that has a little leak current due to the short-circuit between the source line SL and the selection gate line SGSL and is not required to be classified as a bad block.

Figure 18:
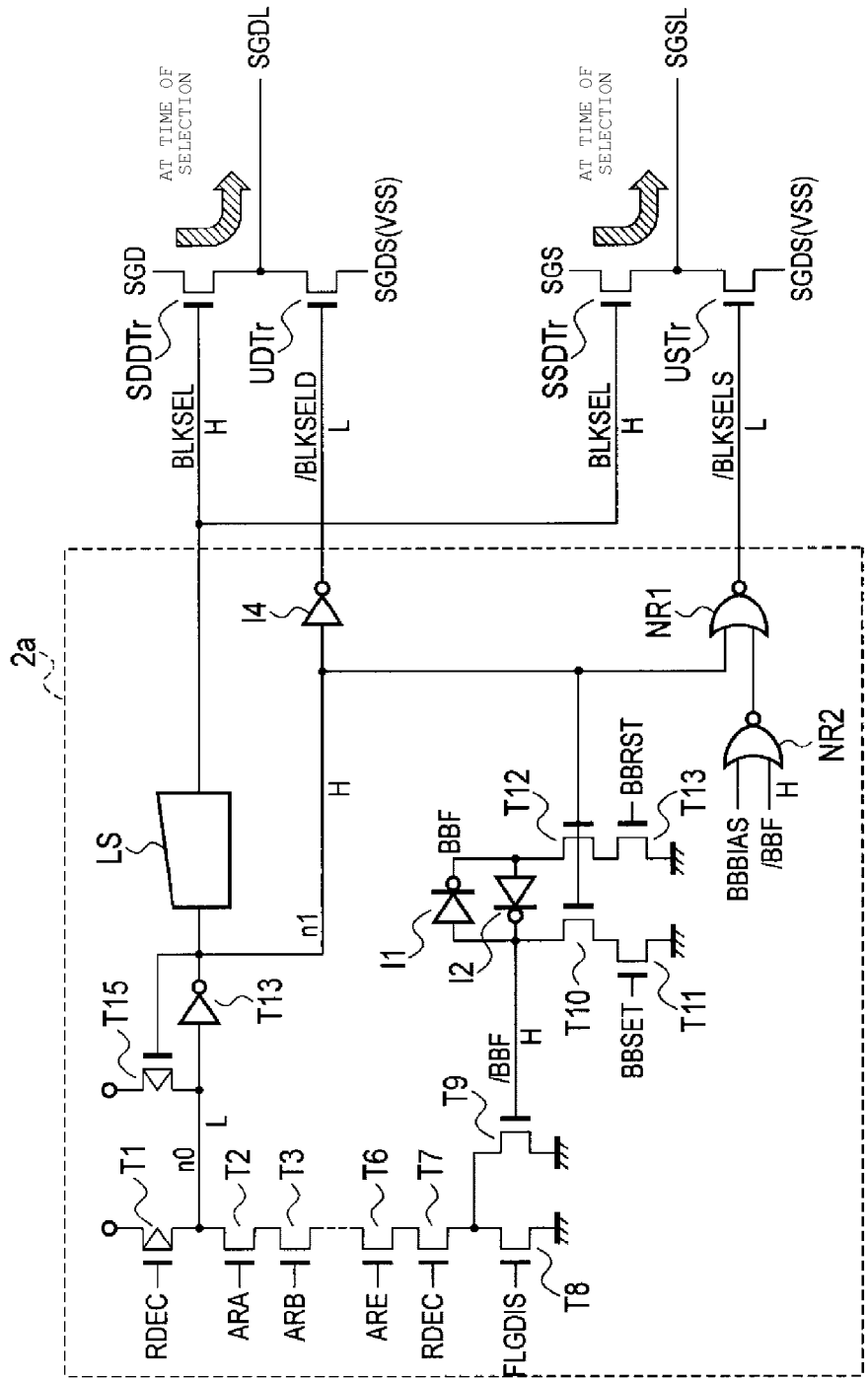
FIG. 18 is a circuit diagram of a block decoder according to a second example of the first embodiment.

The block decoder 2*a* may be as shown in FIG. 18. FIG. 18 is a circuit diagram of a block decoder according to a second example of the first embodiment. As shown in FIG. 18, the block decoder 2*a* includes a NOR gate NR2 instead of the inverters I11 and I12 and the transistors T21 to T24 of FIG. 11. The NOR gate NR2 receives signals BBBIAS and /BBF. An output of the NOR gate NR2 is supplied to the NOR gate NR1. The signal BBBIAS is supplied from, for example, the core driver 9. The signal BBBIAS is set to be at a high level when the signal BBBIAS biases the selection gate line SGSL in a bad block similarly to an ordinary unselected block, and is set to be at a low level when the signal BBBIAS sets the selection gate line SGSL of the bad block to be in a floating state. For example, this is used in an embodiment in which the selection gate line SGSL of the bad block is set to be in a floating state during reading and writing and is not set to be in a floating state during erasing.

FIG. 18 also shows a state of a decoder at the time of the selection of a normal block. In a normal block, the node n1 is at a high level. Therefore, the signal /BLKSELS is at a low level, regardless of the signals BBBIAS and /BBF. As a result, potentials of other nodes are the same as those in FIG. 14, and the potential of the SGS line SGS connected through the transistor SSDT is transferred to the selection gate line SGSL.

Figure 19:
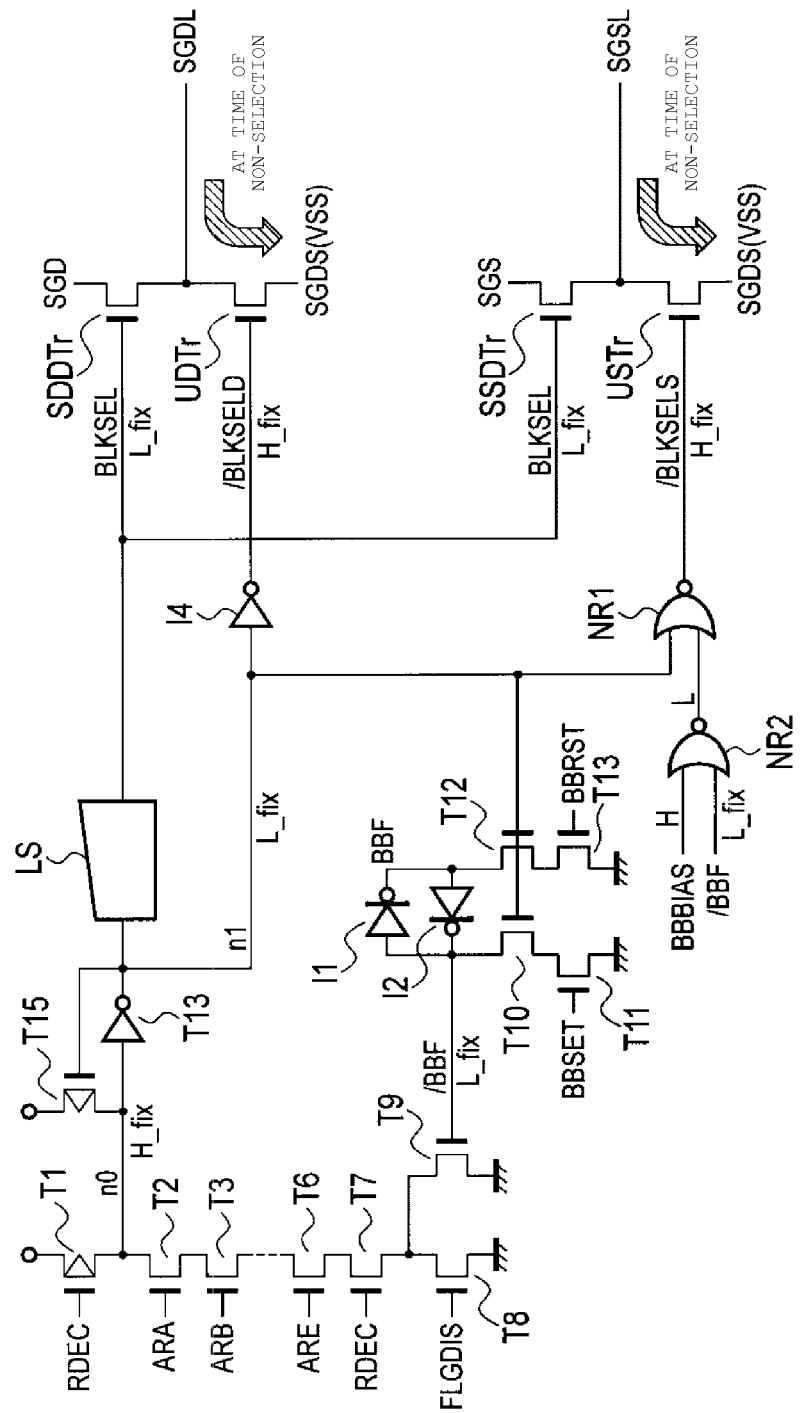
FIG. 19 is a diagram showing one state in the block decoder according to the second example of the first embodiment.

FIG. 19 shows a state of a decoder at the time of the selection of a block which is a bad block but is not to be floated, according to the second example of the first embodiment. As mentioned above, in such a block, the signal BBBIAS is at a high level. For this reason, an output of the NOR gate NR2 is at a low level. Therefore, two inputs of the NOR gate NR1 are all at a low level, and an output of the NOR gate NR1 is at a high level. As a result, other nodes are the same as those in FIG. 15, and the unselected voltage is transferred to the selection gate line SGSL.

Figure 20:
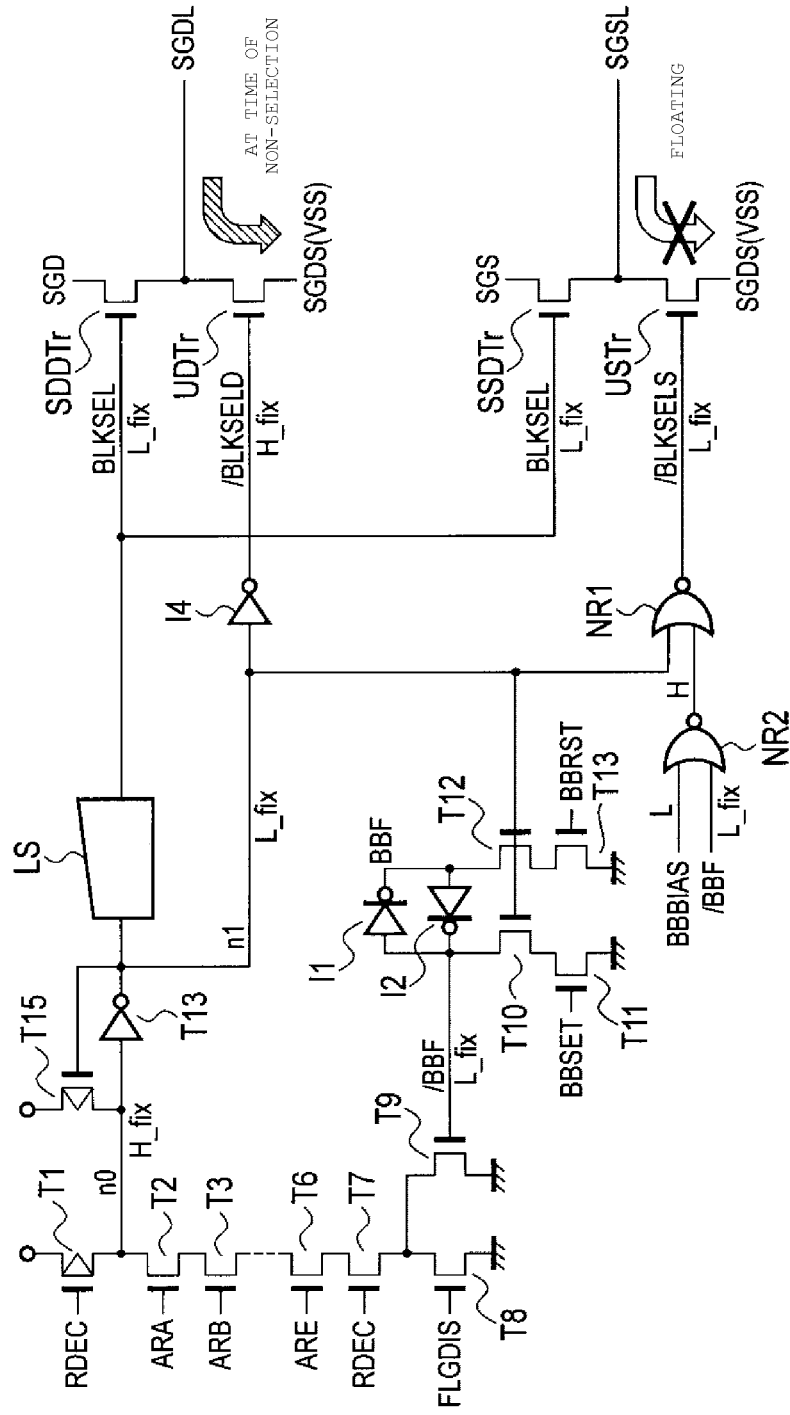
FIG. 20 is a diagram showing one state in the block decoder according to the second example of the first embodiment.

FIG. 20 shows a state of a decoder at the time of the selection of a block which is a bad block and is to be floated, according to the second example of the first embodiment. As mentioned above, in such a block, the signal BBBIAS is at a low level. For this reason, two inputs of the NOR gate NR1 are all at a low level, and the NOR gate NR1 outputs a high level. Thus, an output of the NOR gate NR1 is at a low level. As a result, other nodes are the same as those in FIG. 16, and the selection gate line SGSL is set to be in a floating state.

As mentioned above, according to the semiconductor memory device of the first embodiment, in a block that has the short-circuit between the source line SL and the selection gate line SGSL, the selection gate line SGSL is set to be in a floating state. For this reason, the source line SL is prevented from being pulled by the unselected voltage through the selection gate line SGSL short-circuited to the source line. As a result, it is possible to provide a semiconductor memory device that is capable of a normal operation even when there is short-circuit between the selection gate line SGSL and the source line.

Up to this point, for a countermeasure against the short-circuit of the selection gate line SGSL, an example in which the selection gate line SGSL can be set to be in a floating state has been described. However, the first embodiment may be configured to be capable of setting the selection gate line SGDL to be in a floating state, instead of setting the selection gate line SGSL to be in a floating state. This is useful, for example, in a case where the short-circuit of the selection gate line SGDL occurs in many places. For this reason, an output of the inverter I4 is supplied as the signal /BLKSELS to a gate of the transistor USTr, instead of a gate of the transistor UDTr. Further, an output of the NOR gate NR1 is supplied as the signal /BLKSELD to the gate of the transistor UDTr, instead of the gate of the transistor USTr.

Second Embodiment

Figure 21:
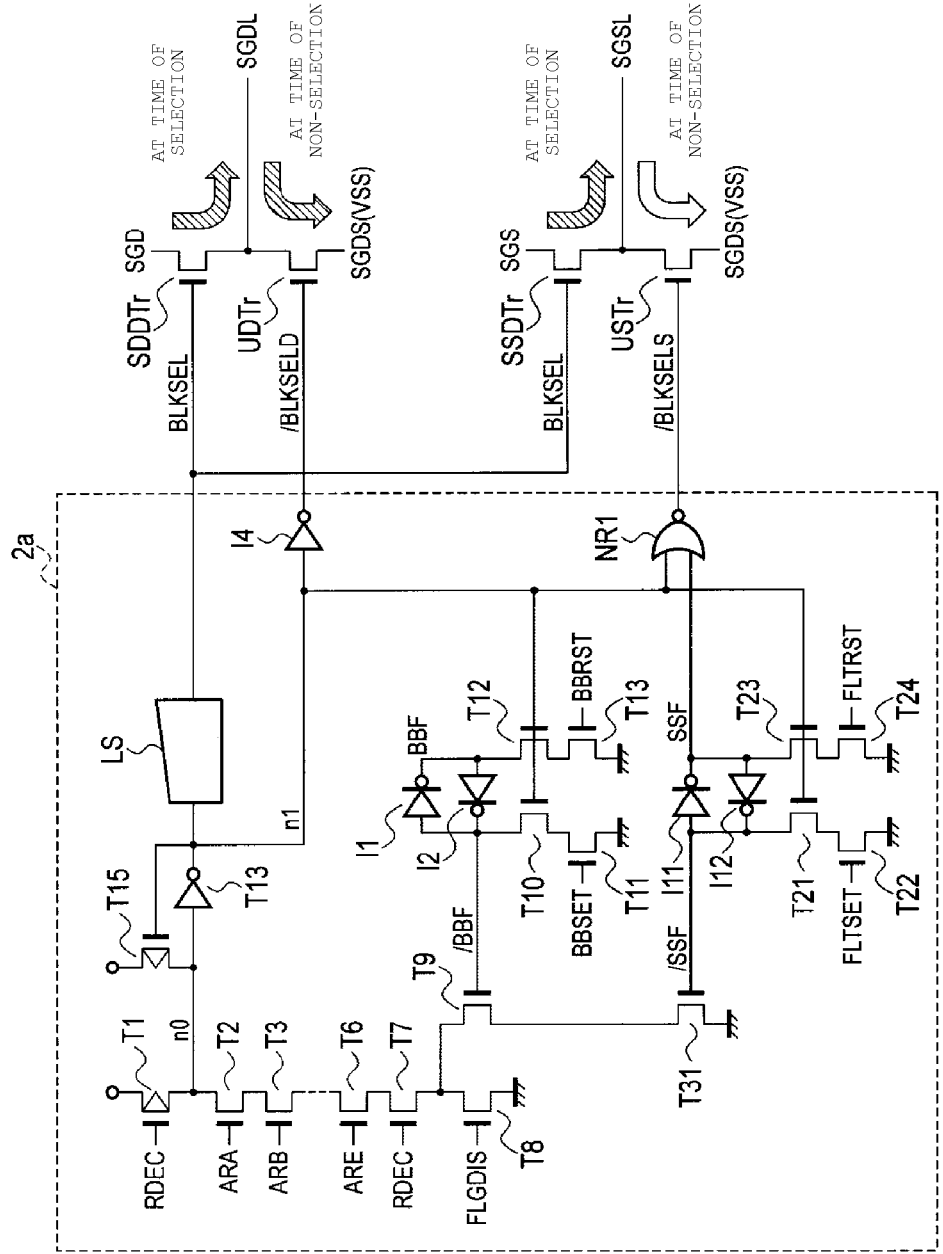
FIG. 21 is a circuit diagram of a block decoder according to a second embodiment.

A second embodiment is different from the first embodiment in terms of a structure of a block decoder. FIG. 21 is a circuit diagram of a block decoder according to the second embodiment. In a semiconductor memory device according to the second embodiment, elements, connection, and characteristics other than those described below are the same as those in the first embodiment.

As shown in FIG. 21, a source of the transistor T9 is grounded through an n-type MOSFET T31, instead of being grounded in the first embodiment (FIG. 11). A gate (referred to as node /SSF) of the transistor T31 is connected to an input of the inverter I11 and an output of the inverter I12. In the second embodiment, an output of the inverter I11 is referred to as SSF, instead of FLTF in the first embodiment.

Figure 22:
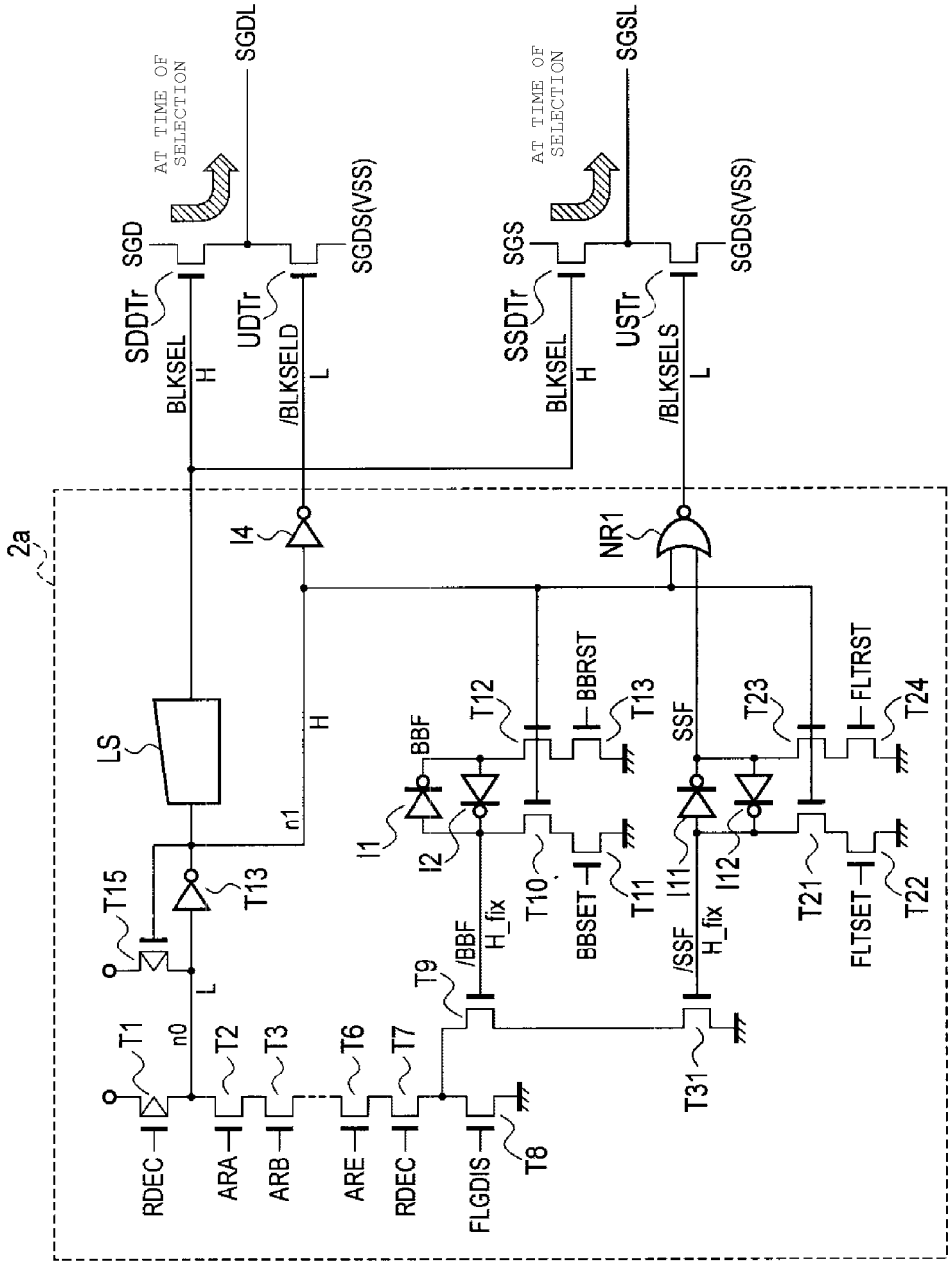
FIG. 22 is a diagram showing one state in the block decoder according to the second embodiment.

FIG. 22 shows a state of a decoder at the time of the selection of a normal block, according to the second embodiment. In the normal block, both a bad block latch and a floating control latch are reset. That is, both the nodes /BBF and /SSF are at a high level. For this reason, the transistors T9 and T31 are turned on, and address decoding can be performed. As a result, the signals BLKSEL, /BLKSELD, and /BLKSELS are changed to a high level, a low level, and a low level, respectively, similarly to the first embodiment (FIG. 14).

Figure 23:
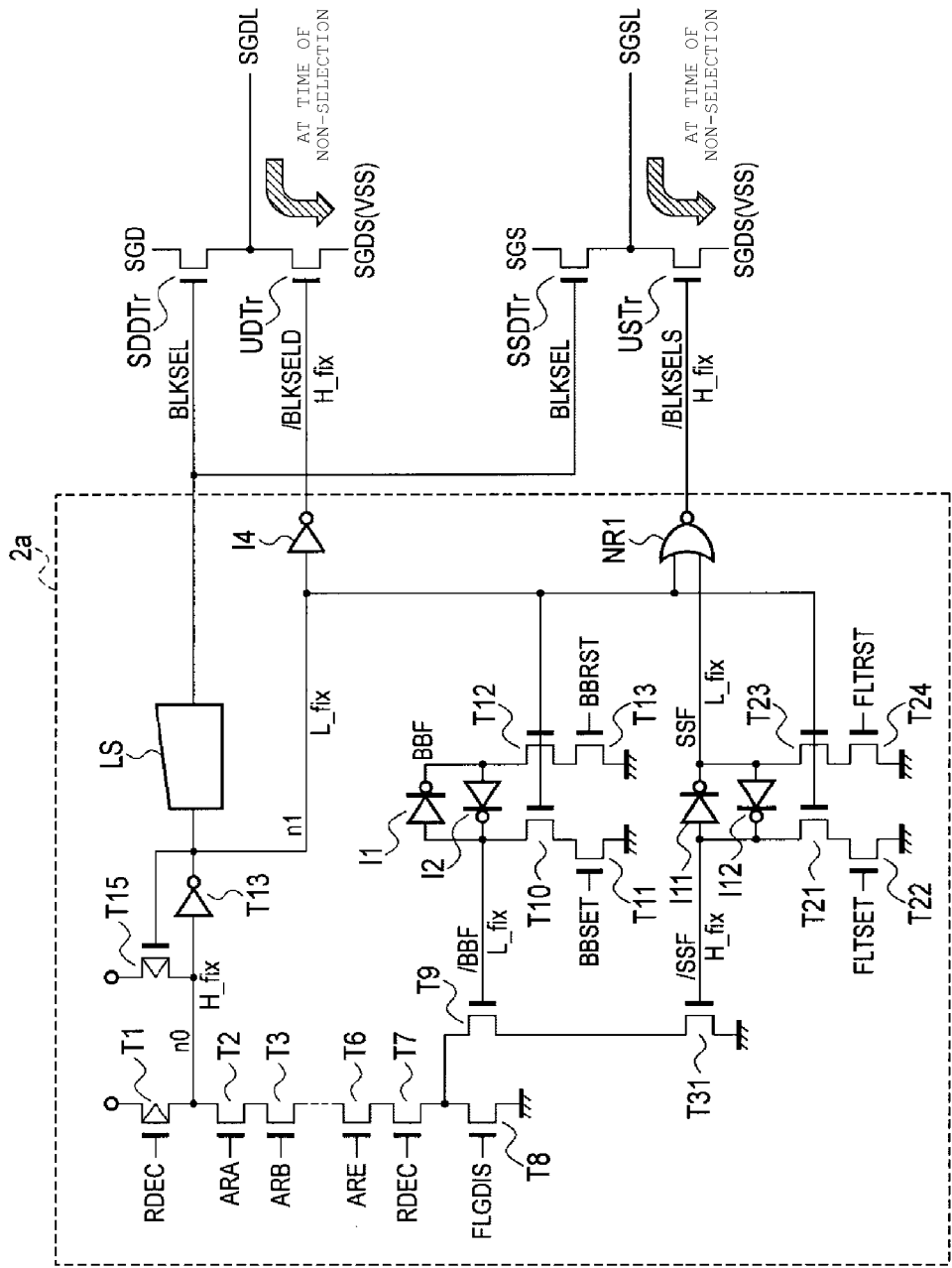
FIG. 23 is a diagram showing one state in the block decoder according to the second embodiment.

FIG. 23 shows a state of a decoder at the time of the selection of a block which is a bad block but is not to be floated, according to the second embodiment. In such a block, a bad block latch and a floating control latch are set and reset, respectively. That is, the nodes /BBF and /SSF are at a low level and a high level, respectively. When the node /BBF is at a low level and the transistor T9 is turned off, even if the transistor T31 is turned on, address decoding cannot be performed. As a result, the signals BLKSEL, /BLKSELD, and /BLKSELS are changed to a low level, a high level, and a high level, respectively, similarly to the first embodiment (FIG. 15).

Figure 24:
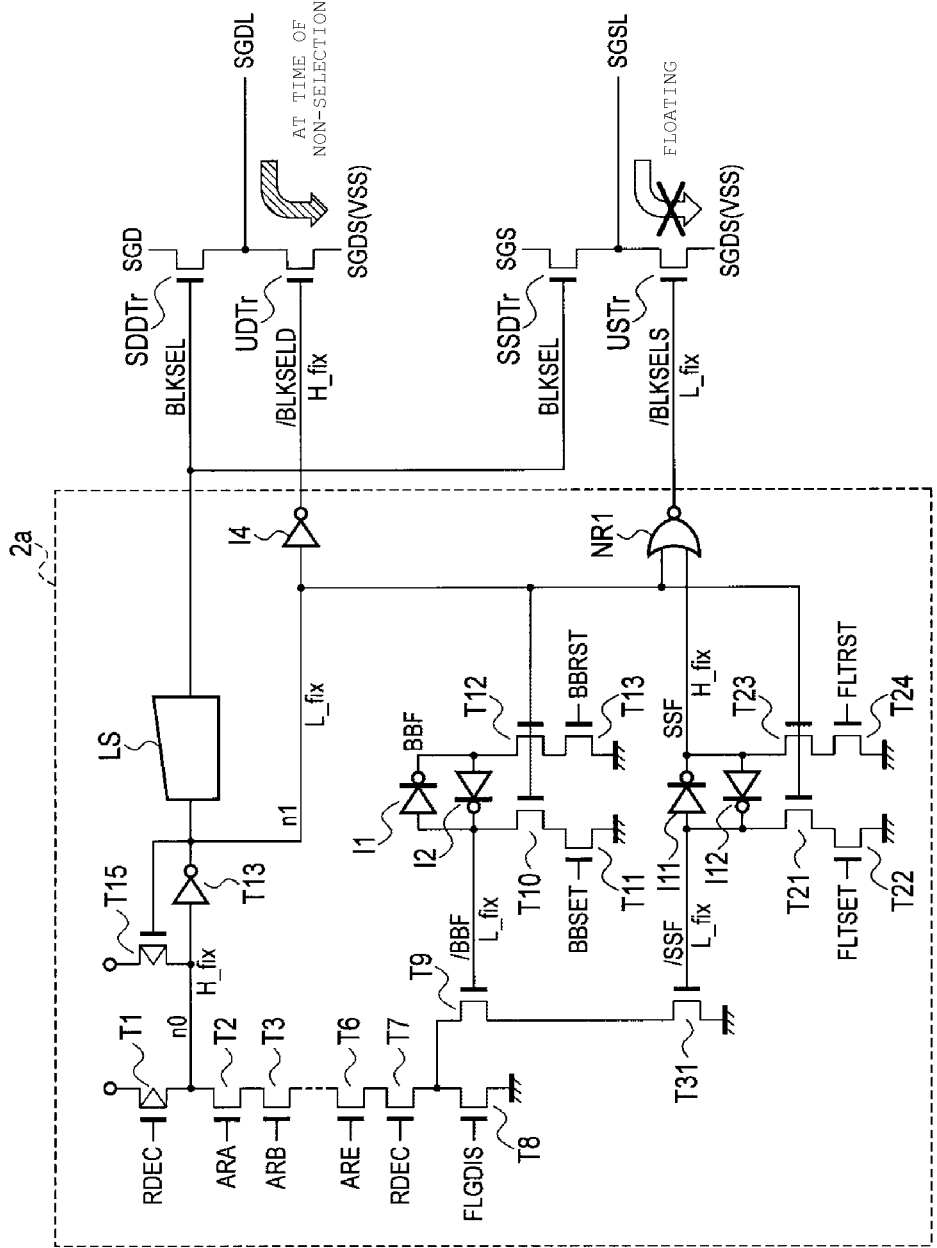
FIG. 24 is a diagram showing one state in the block decoder according to the second embodiment.

FIG. 24 shows a state of a decoder at the time of the selection of a block which is a bad block and is to be floated, according to the second embodiment. In such a block, both a bad block latch and a floating control latch are set. That is, both the nodes /BBF and /SSF are at a low level. Thus, the transistors T9 and 131 are turned off, and address decoding cannot be performed. As a result, the signals BLKSEL, /BLKSELD, and /BLKSELS are changed to a low level, a high level, and a low level, respectively, similarly to the first embodiment (FIG. 16).

Figure 25:
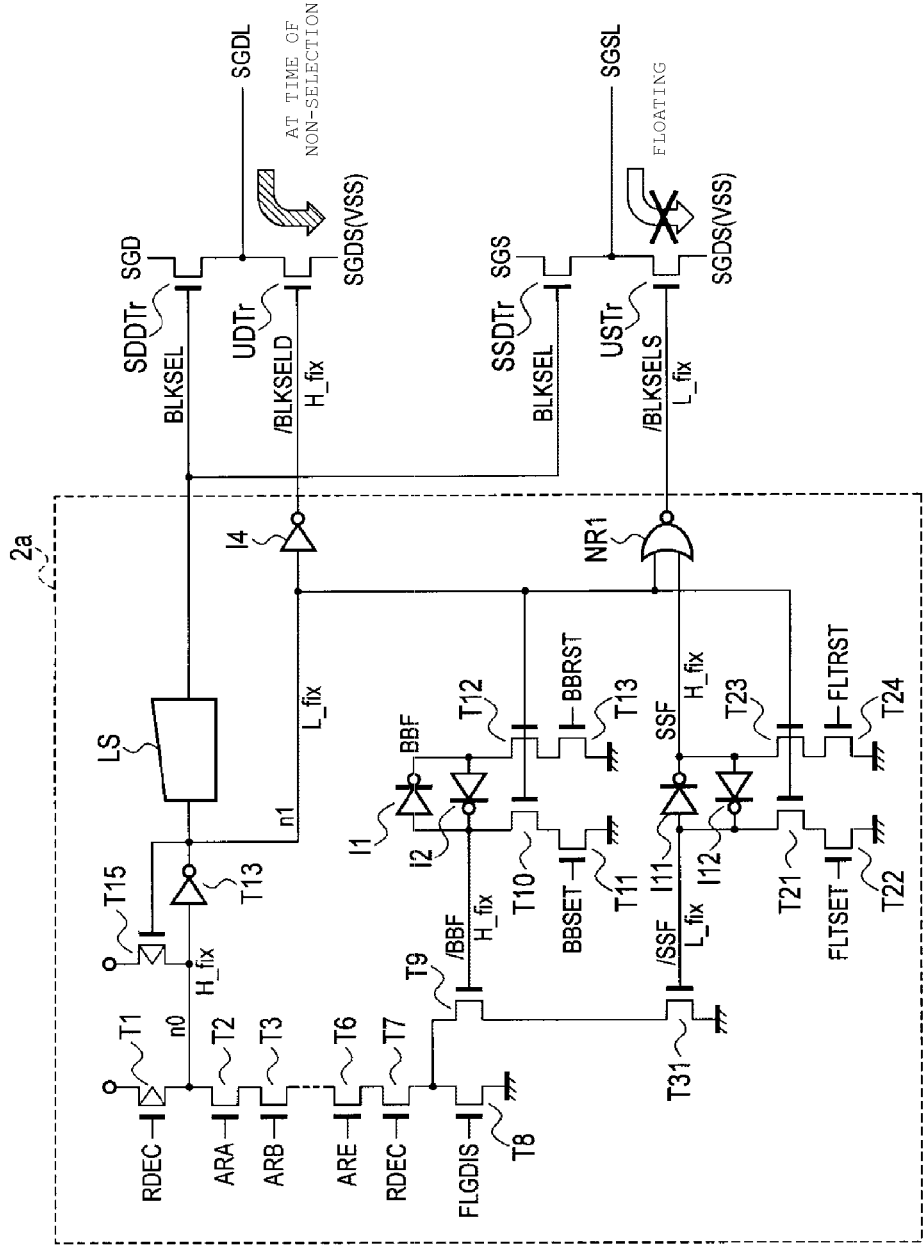
FIG. 25 is a diagram showing one state in the block decoder according to the second embodiment.

FIG. 25 shows a state of a decoder at the time of the selection of a block which is not a bad block but on which floating control is performed, according to the second embodiment. In the second embodiment, the following are different from the first embodiment by the addition of the transistor T31. In a testing process of the semiconductor memory device 10, it is considered that evaluation proceeds in the following order. First, as described in relation to the first embodiment, a leak current due to a short-circuit between the selection gate line SGSL and the source line SL is detected. When the leak current is detected, an address of a block MB that has the short-circuit is held in the memory 20. Then, a floating control latch in the block decoder 2a for a specified block MB is set on the basis of information of the memory 20 at a timing, for example, during power-on reading. Subsequently, an erasing test or a writing test is performed, and thus an address of a bad block is similarly held in the memory 20. Then, a bad block latch in the block decoder 2a for the specified block MB is set on the basis of the address at a timing.

In the first embodiment (FIG. 11), in a case where only the floating control latch is set, the decoding of the block address can be performed without being prohibited. For this reason, when it is desired to prohibit a block to be floated from being decoded, the block is required to be registered as a bad block. This disables the block address from being decoded. As described in relation to the first embodiment, there is also an advantage in a configuration in which a block is to be floated but is not desired to be treated as a bad block. However, when such a control is not desired, according to the second embodiment, in a case where only the floating control latch is set, address decoding in the block decoder 2a that includes the set latch cannot be performed, as shown in FIG. 25. FIG. 25 shows a state of a decoder at the time of the selection of a block which is not a bad block but is to be floated, according to the second embodiment. In such a block, the nodes /BBF and /SSF are at a high level and a low level, respectively. When the node /SSF is at a low level and the transistor T31 is turned off, even if the transistor T9 is turned on, address decoding cannot be performed. As a result, the signals BLKSEL, /BLKSELD, and /BLKSELS are changed to a low level, a high level, and a low level, similarly to FIG. 24.

As mentioned above, according the semiconductor memory device of the second embodiment, similarly to the first embodiment, in a block that has the short-circuit between the source line SL and the selection gate line SGSL, the selection gate line SGSL is set to be in a floating state. For this reason, the same advantages as the first embodiment are obtained. In addition, according to the second embodiment, in a case where only the floating control latch is set, address decoding in the block decoder 2a that includes the latch cannot be performed. For this reason, it is possible to prohibit address decoding in a block on which floating control is to be performed, by performing a smaller number of processes without having to set the bad block latch, similar to a case where the block is registered as a bad block.

Similarly to the first embodiment, the second embodiment may be configured to be capable of setting the selection gate line SGDL to be in a floating state, instead of setting the selection gate line SGSL to be in a floating state. A change required for this is the same as that in the first embodiment.

Third Embodiment

Figure 26:
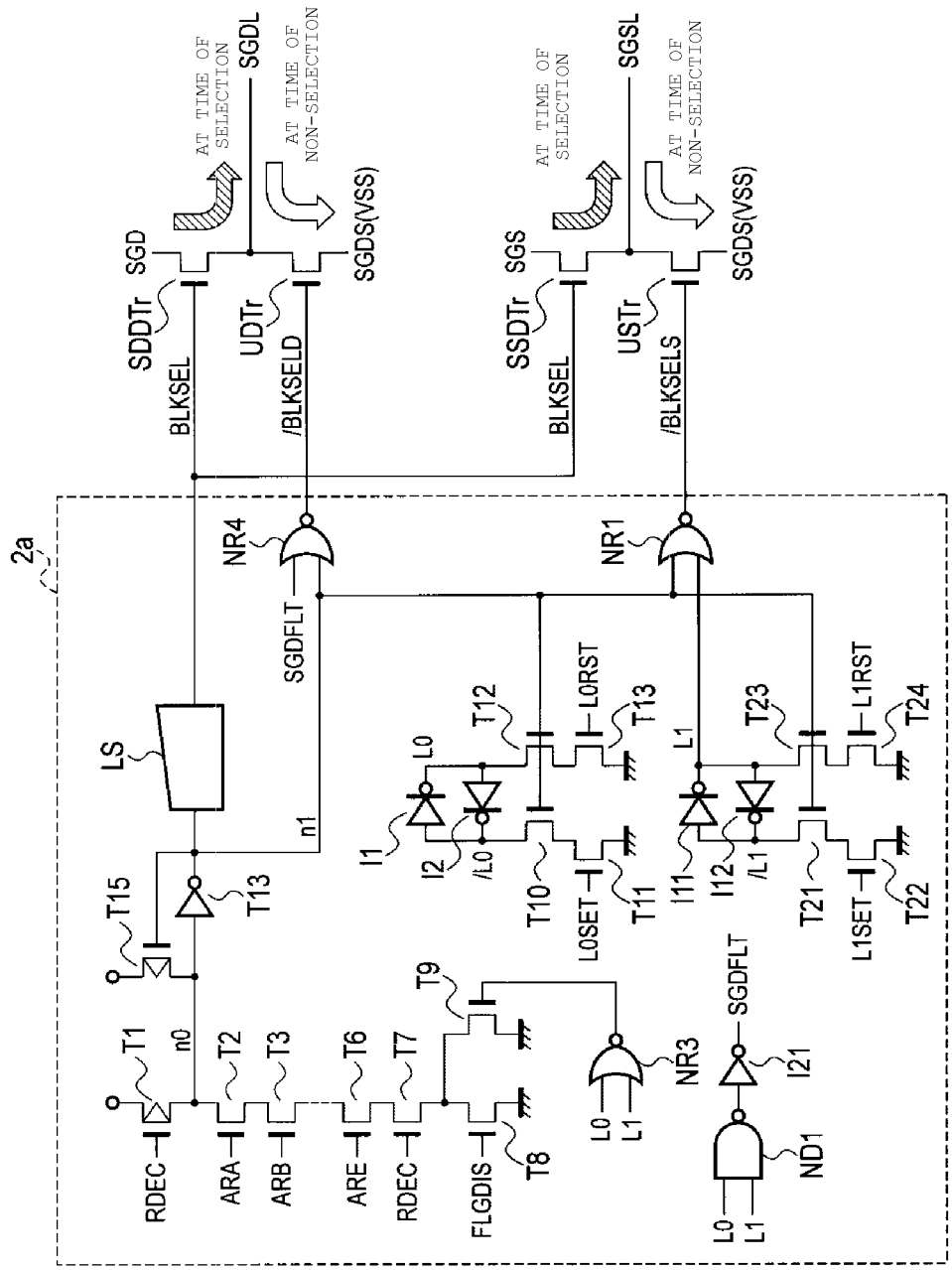
FIG. 26 is a circuit diagram of a block decoder according to a third embodiment.

A third embodiment is different from the first embodiment in terms of a configuration of a block decoder. FIG. 26 is a circuit diagram of a block decoder according to the third embodiment. In a semiconductor memory device according to the third embodiment, elements, connection, and characteristics other than those described below are the same as those in the first embodiment.

As shown in FIG. 26, in the third embodiment, the nodes BBF, /BBF, and FLTF of the first embodiment are referred to as nodes L0, /L0, and L1, respectively. In addition, the signals BBSET, BBRST, FLTSET, and FLTRST of the first embodiment are replaced by signals L0SET, L0RST, L1SET, and L1RST, respectively.

Unlike the first embodiment, a gate of the transistor T9 and an output of the inverter I2 are separated from each other. The gate of the transistor T9 is connected to an output of the NOR gate NR3. The NOR gate NR3 receives signals (signals L0 and L1) on the nodes L0 and L1. The signals L0 and L1 take a level that is determined on the basis of the control with respect to the corresponding block, which will be described below. In addition, the signals L0 and L1 are input to a NAND gate ND1. An output of the NAND gate ND1 is input to an inverter I21. The inverter I21 outputs a signal SGDFLT. A NOR gate NR4 is provided instead of the inverter I4 of the first embodiment. The NOR gate NR4 is connected to the node n1, and receives the signal SGDFLT. The NOR gate NR4 outputs the signal /BLKSELD.

The signals L0 and L1 take a combination of levels shown in FIG. 27. FIG. 27 shows a combination of signals according to the third embodiment. When a block is in a normal state, both the signals L0 and L1 are at a low level. In a block which is a bad block but is not to be floated, the signals L0 and L1 are at a high level and a low level, respectively. In a block which is a bad block and in which the selection gate line SGSL is to be floated, the signals L0 and L1 are at a low level and a high level, respectively. In a block which is a bad block and in which both the selection gate lines SGSL and SGDL are to be floated, both the signals L0 and L1 are at a high level.

The levels of the signals L0 and L1 are controlled in accordance with timing charts shown in FIGS. 28 and 29. FIG. 28 is a timing chart for resetting the latch according to the third embodiment. FIG. 29 is a timing chart for setting the latch according to the third embodiment. FIG. 28 is the same as FIG. 12 except that the signals BBSET, BBRST, FLTSET, and FLTRST are replaced by the signals L0SET, L0RST, L1SET, and L1RST, respectively. Similarly, FIG. 29 is the same as FIG. 13 except that the signals BBSET, BBRST, FLTSET, and FLTRST are replaced by the signals L0SET, L0RST, L1SET, and L1RST, respectively. For example, the control circuit 5 sets the levels of the nodes L0SET, L0RST, L1SET, and L1RST according to whether a certain block is a bad block and whether only the selection gate line SGSL or both the selection gate lines SGSL and SGDL have to be set to be in a floating state. Information is held by the memory 20 in a non-volatile manner, regarding whether a certain block is a bad block and whether only the selection gate line SGSL or both the selection gate lines SGSL and SGDL have to be set to be in a floating state.

Referring back to FIG. 26, in a normal block, both first and second latches are reset. That is, both the nodes L0 and L1 are at a low level. For this reason, the transistor T9 is turned on, and address decoding can be performed. In addition, the node n1 is at a high level, but the signal SGDFLT is at a low level, and thus the signal /BLKSELD is at a low level. As a result, the signal BLKSEL is changed to a high level, and the signal /BLKSELD is changed to a low level, and thus a potential of the SGD line SGD connected through the transistor SDDTr is transferred to the selection gate line SGDL. In addition, in addition to the signal BLKSEL that is at a high level, the signal /BLKSELS is changed to a low level, and thus a potential of the SGS line SGS connected through the transistor SSDTr is transferred to the selection gate line SGSL.

In a bad block, the first and second latches are set and reset, respectively. That is, the nodes L0 and L1 are at a high level and a low level, respectively. For this reason, the transistor T9 is turned off, and address decoding cannot be performed. In addition, since both the node n1 and the signal SGDFLT are at a low level, the signals BLKSEL, /BLKSELD, and /BLKSELS are at a low level, a high level, and a high level, respectively. As a result, the unselected voltage is transferred to the selection gate lines SGDL and SGSL.

In a block which is a bad block and in which only the selection gate line SGSL is to be floated, the first and second latches are reset and set, respectively. That is, the nodes L0 and L1 are at a low level and a high level, respectively. For this reason, the transistor T9 is turned off, and address decoding cannot be performed. In addition, since both the node n1 and the signal SGDFLT are at a low level, the signals BLKSEL and /BLKSELD are at a low level and a high level, respectively. As a result, the unselected voltage is transferred to the selection gate line SGDL. On the other hand, in addition to the signal BLKSEL that is at a low level, the signal /BLKSELS is at a low level, and thus the selection gate line SGSL is set to be in a floating state.

In a block which is a bad block and in which both the selection gate lines SGSL and SGDL are to be floated, both the first and second latches are set. That is, both the nodes L0 and L1 are at a high level. For this reason, the transistor T9 is turned off, and address decoding cannot be performed. In addition, since the node n1 and the signal SGDFLT are at a low level and a high level, respectively, the signals BLKSEL, /BLKSELD, and /BLKSELS are all at a low level. For this reason, both the selection gate lines SGDL and SGSL are in a floating state.

As mentioned above, according to the semiconductor memory device of the third embodiment, similarly to the first embodiment, in a block that has the short-circuit between the source line SL and the selection gate line SGSL, the selection gate line SGSL is set to be in a floating state. For this reason, the same advantages as the first embodiment are obtained. In addition, according to the third embodiment, in a selected block, it is also possible to set the selection gate line SGDL to be in a floating state, in addition to the selection gate line SGSL.

Similarly to the first embodiment, the third embodiment may be configured to be capable of setting the selection gate line SGDL to be in a floating state, in addition to setting the selection gate line SGSL to be in a floating state. For this, first, an output of the NOR gate NR4 of FIG. 26 is supplied as the signal /BLKSELS to a gate of the transistor USTr, instead of a gate of the transistor UDTr. Further, an output of the NOR gate NR1 is supplied as the signal /BLKSELD to the gate of the transistor UDTr, instead of the gate of the transistor USTr. By this change, in the third embodiment, when the signals L0 and L1 are at a low level and a high level, respectively, an object block is a bad block, and the selection gate line SGDL of the block is set to be in a floating state.

Fourth Embodiment

Figure 30:
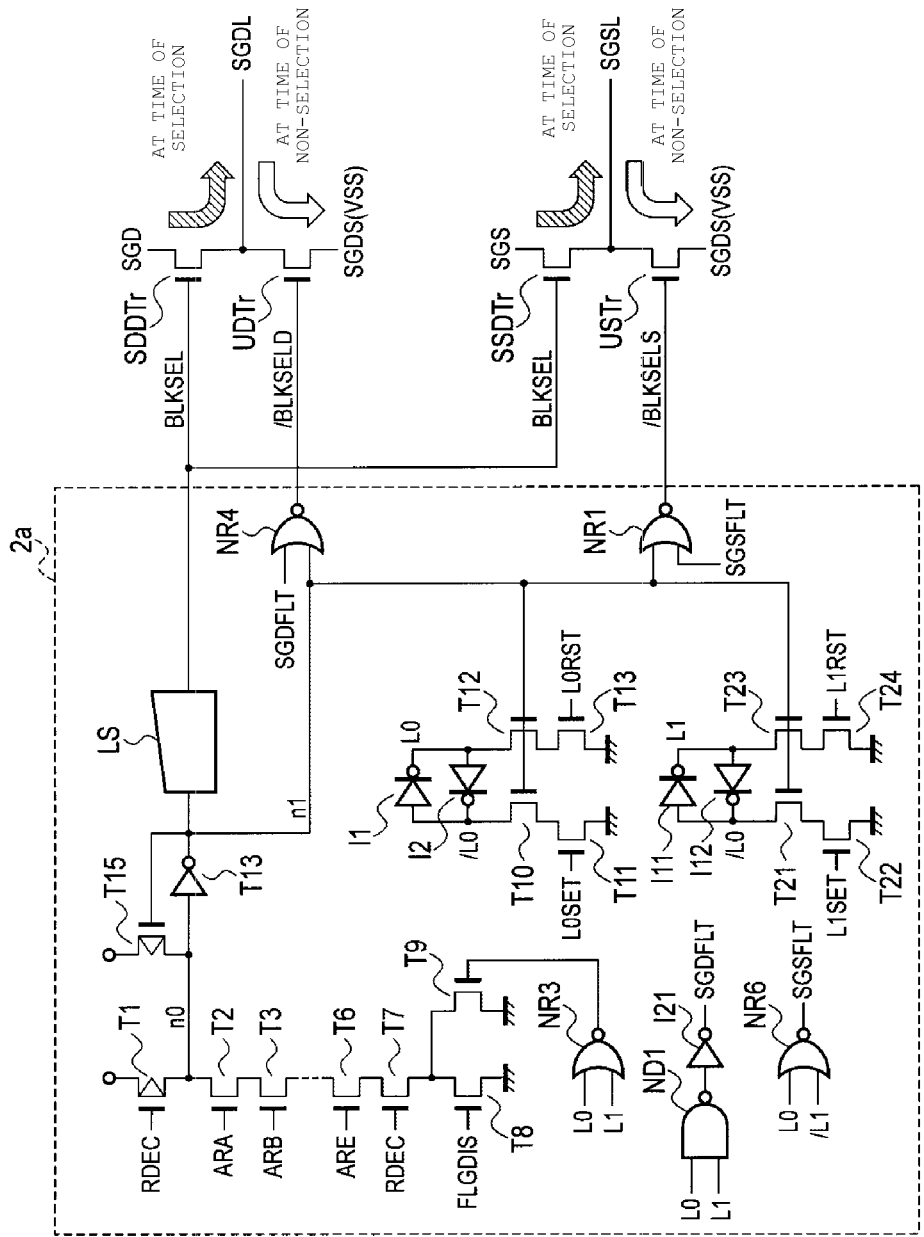
FIG. 30 is a circuit diagram of a block decoder according to a fourth embodiment.

A fourth embodiment is different from the first embodiment in terms of a configuration of a block decoder. FIG. 30 is a circuit diagram of a block decoder according to the fourth embodiment. Elements, connection, and characteristics other than the block decoder of a semiconductor memory device according to the fourth embodiment are the same as those in the first embodiment.

As shown in FIG. 30, the block decoder 2a includes a NOR gate NR6, in addition to the elements and the connection of the third embodiment. The NOR gate NR6 receives the signals L0 and /L1, and outputs the signal SGSFLT. The signal SGSFLT is input to the NOR gate NR1 by being changed to a signal on the node n1 in the third embodiment.

The signals L0 and L1 take a combination of levels shown in FIG. 31. FIG. 31 shows a combination of signals according to the fourth embodiment. When a block is in a normal state, both the signals L0 and L1 are at a low level. When a block is a bad block but is not to be floated, the signals L0 and L1 are at a high level and a low level, respectively. When a block is a bad block and in which the selection gate line SGSL is to be floated, the signals L0 and L1 are at a low level and a high level, respectively. When a block is a bad block and in which the selection gate line SGDL is to be floated, both the signals L0 and L1 are at a high level.

In a normal block, both first and second latches are reset. That is, both the nodes L0 and L1 are at a low level. For this reason, the transistor T9 is turned on, address decoding can be performed. In addition, since the node n1 and the signal SGDFLT are at a high level and a low level, respectively, the signals BLKSEL and the /BLKSELD are at a high level and a low level, respectively. As a result, a potential of the SGD line SGD connected through the transistor SDDTr is transferred to the selection gate line SGDL. In addition, since the node n1 and the signal SGSFLT are at a high level and a low level, respectively, the signal /BLKSELS is at a low level. As a result, a potential of the SGS line SGS connected through the transistor SSDTr is transferred to the selection gate line SGSL.

In a bad block, the first and second latches are set and reset, respectively. That is, both the nodes L0 and L1 are at a high level and a low level, respectively. For this reason, the transistor T9 is turned off, and address decoding cannot be performed. In addition, since the node n1 and the signals SGDFLT and SGSFLT are all at a low level, the signals BLKSEL, /BLKSELD, and /BLKSELS are at a low level, a high level, and a high level, respectively. As a result, the unselected voltage is transferred to the selection gate lines SGDL and SGSL.

In a block which is a bad block and in which only the selection gate line SGSL is to be floated, the first and second latches are reset and set, respectively. That is, the nodes L0 and L1 are at a low level and a high level, respectively. For this reason, the transistor T9 is turned off, and address decoding cannot be performed. In addition, since both the node n1 and the signal SGDFLT are at a low level, the signals BLKSEL and /BLKSELD are at a low level and a high level, respectively. As a result, the unselected voltage is transferred to the selection gate line SGDL. On the other hand, since the node n1 and the signal SGSFLT are at a low level and a high level, respectively, both the signals BLKSEL and /BLKSELD are at a low level. As a result, the selection gate line SGSL is changed to a floating state.

In a block which is a bad block and in which only the selection gate line SGDL is to be floated, both the first and second latches are set. That is, both the nodes L0 and L1 are at a high level. For this reason, the transistor T9 is turned off, and address decoding cannot be performed. In addition, since the node n1 and the signal SGDFLT are at a low level and a high level, respectively, both the signals BLKSEL and /BLK-SELD are at a low level. As a result, the selection gate line SGDL is changed to a floating state. On the other hand, since both the node n1 and the signal SGSFLT are at a low level, the signals BLKSEL and /BLKSELS are at a low level and a high level, respectively. As a result, the unselected voltage is transferred to the selection gate line SGDL.

Figure 32:
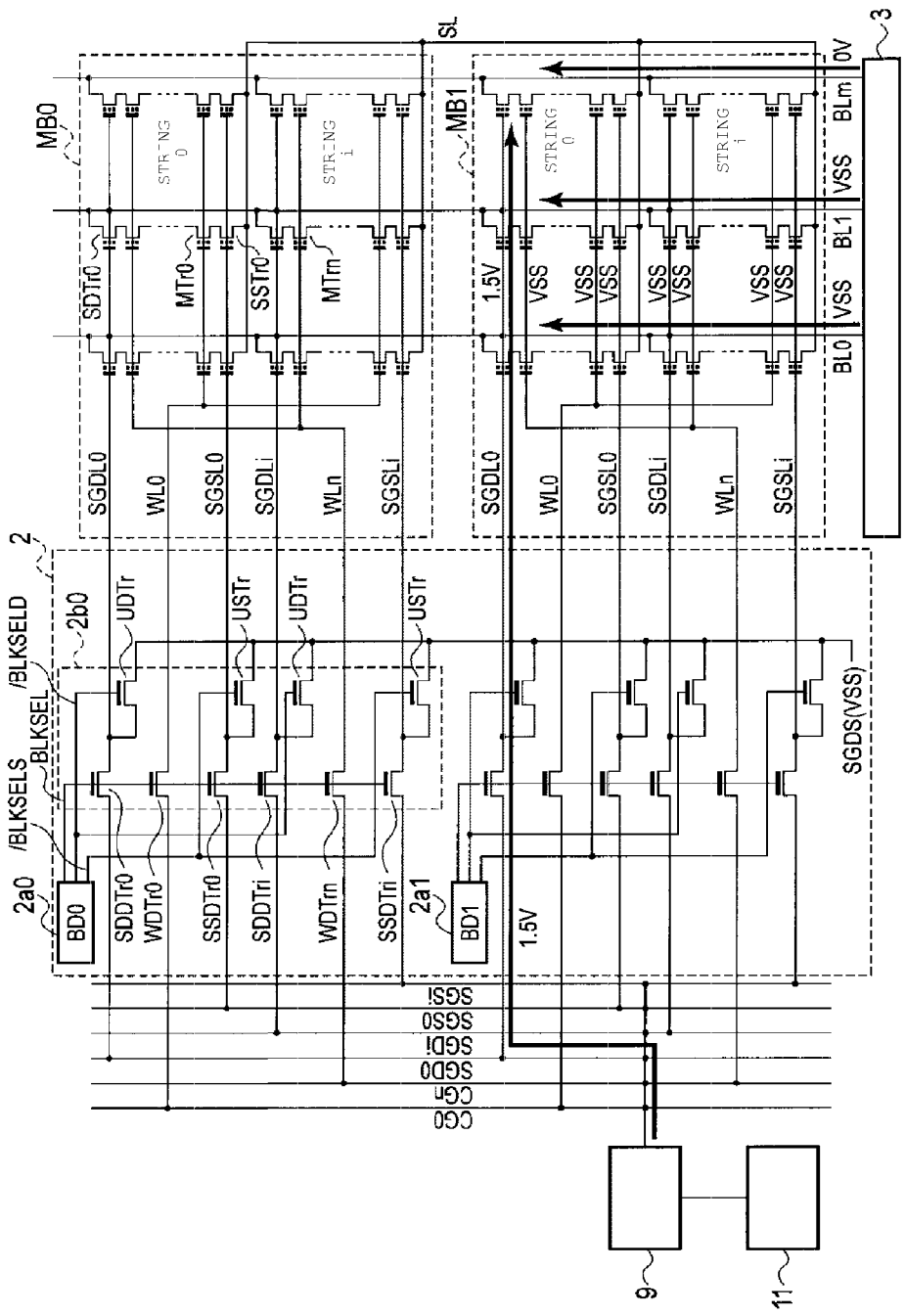
FIG. 32 is a diagram showing a method of detecting a leak current according to the fourth embodiment.

Japanese Patent Application No. 2011-133942 discloses an idea in which a potential of a bit line is increased through coupling by raising a selection gate line on the drain side of a unselected block by a potential after the bit line is set to be in a floating state. At this time, when a short-circuit occurs between the bit line and the selection gate line on the drain side, there is a possibility of the potential of the bit line decreasing, or of an ability to pushing up the bit line being insufficient. Similarly, even in a case where a short-circuit occurs between the selection gate line on the drain side and an adjacent word line, the bit line boosting may be insufficient. Therefore, a leak current passing through the selection gate line SGDL on the drain side is detected using a method shown in FIG. 32. FIG. 32 shows a method of detecting a leak current according to the fourth embodiment. In particular, FIG. 32 shows a state for detecting a short-circuit between the selection gate line SGDL (for example, SGDL0) in the selected block MB1 and elements around the selection gate line. The leakage detection circuit 11 is configured to be capable of performing operations that are shown in FIG. 32 and are described below.

First, the leakage detection circuit 11 applies, for example, 1.5 V to the selection gate line SGDL0 to be evaluated through the core driver 9, and applies a voltage VSS to the remaining selection gate lines SGDL and SGSL in the selected block MB1 and all the word lines WL. Based on the application of a voltage, the leakage detection circuit 11 can detect the presence of a leak current (short-circuit) through the selection gate line SGDL0 to be evaluated.

In the block decoder 2a for the block MB that has the selection gate line SGDL short-circuited to other elements which are detected in this manner, both the nodes L0 and L1 are set to be at a high level. As a result, first, the block acts as a bad block, and decoding cannot be performed. In addition, during the bit line boosting, the selection gate line SGDL is changed to a floating state, and thus the selection gate line can be electrically separated from a wiring and a driver which are connected to the selection gate line SGDL of the unselected block for the bit line boosting. In this manner, a desired bit line boosting can be executed.

As mentioned above, according to the semiconductor memory device of the fourth embodiment, similarly to the first embodiment, in a block that has the short-circuit between the source line SL and the selection gate line SGSL, the selection gate line SGSL is set to be in a floating state. For this reason, the same advantages as the first embodiment are obtained. In addition, according to the fourth embodiment, in a block that has the selection gate line SGDL short-circuited to other elements, the selection gate line SGDL is set to be in a floating state. For this reason, a desired bit line boosting can be executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
 a string of memory cell transistors that are connected to each other in series;
 a first selection transistor that is connected between a first end of the string of the memory cell transistors and a source line, a gate of the first selection transistor being connected to a first line;
 a second selection transistor that is connected between a second end of the string of the memory cell transistors and a bit line, a gate of the second selection transistor being connected to a second line;
 a driver configured to generate selected and unselected voltages for the first and second transistors;
 transfer transistors between the driver and the first and second selection transistors, the transfer transistors being controllable to set at least one of the first and second lines to be in a floating state;
 a first latch configured to hold information about whether or not a block containing the string of memory cell transistors is a bad block; and
 a second latch configured to hold information about whether or not one of the first and second lines is to be set in a floating state.

2. The semiconductor memory device according to claim 1, wherein
 the second latch is configured to hold information about whether or not the first line is to be set in a floating state.

3. The semiconductor memory device according to claim 2, wherein the transfer transistors include a first transfer transistor between a selected voltage source and the first line, and a second transfer transistor between an unselected voltage source and the first line, the first line being set in the floating state when the first and second transfer transistors are both turned off.

4. The semiconductor memory device according to claim 1, wherein
 the second latch is configured to hold information about whether or not the second line is to be set in a floating state.

5. The semiconductor memory device according to claim 4, wherein the transfer transistors include a first transfer transistor between a selected voltage source and the second line, and a second transfer transistor between an unselected voltage source and the second line, the second line being set in the floating state when the first and second transfer transistors are both turned off.

6. A semiconductor memory device comprising:
 a string of memory cell transistors that are connected to each other in series;

a first selection transistor that is connected between a first end of the string of the memory cell transistors and a source line, a gate of the first selection transistor being connected to a first line;

a second selection transistor that is connected between a second end of the string of the memory cell transistors and a bit line, a gate of the second selection transistor being connected to a second line;

a driver configured to generate selected and unselected voltages for the first and second transistors;

transfer transistors between the driver and the first and second selection transistors, the transfer transistors being controllable to set at least one of the first and second lines to be in a floating state;

a first latch configured to hold information about whether or not the first line is to be set in a floating state; and a second latch configured to hold information about whether or not the second line is to be set in a floating state.

7. The semiconductor memory device according to claim 1, further comprising:

a block decoder that generates block select and block non-select signals that are used to control the transfer transistors to be switched on or off.

8. A semiconductor memory device comprising:

a block including, a string of memory cell transistors that are connected to each other in series; and a selection transistor that is connected between one end of the string of the memory cell transistors and one of a source line and a bit line;

a line that is connected to a gate electrode of the selection transistor;

a first transistor;

a first latch configured to hold a first data about whether or not a block containing the string of memory cell transistors is a bad block;

a second latch configured to hold a second data; and a logic circuit that is electrically connected to the second latch, wherein one end of the first transistor is connected to the first line, and an output end of the logic circuit is connected to a gate of the first transistor.

9. The semiconductor memory device according to claim 8, further comprising:

a second transistor connected between a driver that supplies a selected voltage and the line wherein the line is connected to a node that supplies an unselected voltage through the first transistor.

10. The semiconductor memory device according to claim 9, further comprising:

a latch that, when set, causes the first and second transfer transistors to be turned off.

11. The semiconductor memory device according to claim 9, further comprising:

a first latch that, when set, causes the first and second transistors to be turned off; and a second latch that, when set, causes the first transistor to be turned on and the second transistor to be turned off.

12. The semiconductor memory device according to claim 9, further comprising:

a first latch that, when set, causes the first and second transistors to be turned off; and a second latch that, when set and the first latch is not set, causes the first transistor to be turned on and the second transistor to be turned off, and when set and the first latch is set, the first and second transistors are turned off.

13. The semiconductor memory device according to claim 9, wherein the first and second transistors are turned off during reading and writing processes, but not during an erasing process.

14. The semiconductor memory device according to claim 8, wherein the selection transistor is connected between the one end of the string of the memory cell transistors and the source line.

15. The semiconductor memory device according to claim 8, wherein the selection transistor is connected between the one end of the string of the memory cell transistors and the bit line.

16. A semiconductor memory device comprising:

a string of memory cell transistors that are connected to each other in series;

a selection transistor that is connected between one end of the string of the memory cell transistors and one of a source line and a bit line;

a line that is connected to a gate electrode of the selection transistor, is connected to a driver through a first transfer transistor, and is connected to a first node that supplies an unselected voltage through a second transfer transistor;

a block decoder configured to generate block select and block non-select signals that are used to control the first and second transfer transistors to be switched on and off;

a first latch that, when set, holds information indicating non-selection of the line even when an address for selecting the line is input thereto; and a second latch that, when set, causes the first and second transfer transistors to be turned off.

17. The semiconductor memory device according to claim 16, wherein the first and second transfer transistors are turned off during reading and writing processes, but not during an erasing process.

18. The semiconductor memory device according to claim 16, wherein the selection transistor is connected between the one end of the string of the memory cell transistors and the source line.

19. The semiconductor memory device according to claim 16, wherein the selection transistor is connected between the one end of the string of the memory cell transistors and the bit line.

* * * * *